(12) United States Patent
Olsen

(10) Patent No.: US 10,992,314 B2
(45) Date of Patent: Apr. 27, 2021

(54) RESIDUE NUMBER SYSTEMS AND METHODS FOR ARITHMETIC ERROR DETECTION AND CORRECTION

(71) Applicant: Eric B. Olsen, Las Vegas, NV (US)

(72) Inventor: Eric B. Olsen, Las Vegas, NV (US)

(73) Assignee: Olsen IP Reserve, LLC, Henderson, NV (US)

( * ) Notice: Subject to any disclaimer, the term of this patent is extended or adjusted under 35 U.S.C. 154(b) by 236 days.

(21) Appl. No.: 16/253,119

(22) Filed: Jan. 21, 2019

(65) Prior Publication Data

US 2020/0235751 A1 Jul. 23, 2020

(51) Int. Cl.
*G06F 7/72* (2006.01)
*H03M 13/03* (2006.01)

(52) U.S. Cl.
CPC ............ *H03M 13/03* (2013.01); *G06F 7/729* (2013.01)

(58) Field of Classification Search
CPC ........ H03M 13/03; H03M 13/07; G06F 7/729
USPC ......................................................... 714/746
See application file for complete search history.

(56) References Cited

U.S. PATENT DOCUMENTS

| | | | |
|---|---|---|---|
| 4,281,391 A | 7/1981 | Huang | |
| 4,588,980 A | 5/1986 | Bernardson | |
| 4,910,699 A | 3/1990 | Capps | |
| 4,948,959 A | 8/1990 | Houk | |
| 4,963,869 A | 10/1990 | Falk | |
| 4,996,527 A | 2/1991 | Houk | |
| 5,050,120 A | 9/1991 | Houk | |
| 5,107,451 A | 4/1992 | Houk | |
| 5,117,383 A | 5/1992 | Fujita | |
| 7,489,705 B2 * | 2/2009 | Sachs | H04L 1/1678 370/467 |
| 7,523,151 B1 * | 4/2009 | Mellott | G06F 7/729 708/491 |
| 8,051,124 B2 | 11/2011 | Salama et al. | |
| 8,195,735 B2 | 6/2012 | Hansen | |
| 8,219,865 B2 * | 7/2012 | Murakami | H03M 13/255 714/746 |
| 8,607,112 B2 * | 12/2013 | Roh | H03M 13/13 714/746 |

(Continued)

FOREIGN PATENT DOCUMENTS

| | | |
|---|---|---|
| CA | 2868833 | 11/2013 |
| EP | 1068565 B1 | 9/2009 |

(Continued)

OTHER PUBLICATIONS

Thu Van Vu, Efficient Implementations of the Chinese Remainder Theorem for Sign Detection and Residue Decoding, IEEE Transactions on Computers, vol. C-34, No. 7, Jul. 1985, pp. 646-651, XP011291045, IEEE Service Center, Los Alamitos, CA, ISSN: 0018-9340, section III.

(Continued)

*Primary Examiner* — Albert Decady
*Assistant Examiner* — Enam Ahmed
(74) *Attorney, Agent, or Firm* — Lightbulb IP, LLC

(57) ABSTRACT

A method and apparatus for detecting and correcting digit errors of arithmetic results and signed data represented in a redundant residue number system (RRNS) and further represented using a non-systematic method of complements suitable for processing by a complement based digital arithmetic of the full redundant range.

10 Claims, 32 Drawing Sheets

(56) References Cited

U.S. PATENT DOCUMENTS

| | | |
|---|---|---|
| 9,081,608 B2 | 7/2015 | Olsen |
| 9,311,050 B2 | 4/2016 | Olsen |
| 9,395,952 B2 | 7/2016 | Olsen |
| 9,712,185 B2 | 7/2017 | Olsen |
| 2006/0010190 A1 | 1/2006 | Shimbo |
| 2006/0184600 A1* | 8/2006 | Maruo .................... G06F 7/729 708/491 |
| 2009/0024906 A1* | 1/2009 | Calderbank .......... H04L 1/0618 714/782 |
| 2009/0202067 A1 | 8/2009 | Michaels |
| 2010/0174960 A1* | 7/2010 | Suzuki ................. G10L 19/032 714/746 |
| 2011/0231465 A1 | 9/2011 | Phatak |
| 2013/0311532 A1 | 11/2013 | Olsen |
| 2014/0129601 A1 | 5/2014 | Olsen |
| 2014/0139365 A1* | 5/2014 | Vun ....................... G06F 7/729 341/155 |
| 2015/0106414 A1 | 4/2015 | Olsen |
| 2015/0339103 A1 | 11/2015 | Olsen |
| 2016/0342891 A1 | 11/2016 | Ross |

FOREIGN PATENT DOCUMENTS

| | | |
|---|---|---|
| EP | 2761432 | 8/2014 |
| RU | 2318238 | 2/2008 |
| WO | WO2013176852 | 11/2013 |

OTHER PUBLICATIONS

Cardarilli G C et al, RNS Realization of Fast Fixed-Point Multipliers with Large Wordlengths, ISCAS 1989, vol. 1 of 3, May 1989, pp. 212-215, XP000131600, IEEE, New York, NY, p. 212, right col. para. 1, section 3.

Arnold M G, The Residue Logarithmic Number System: Theory and Implementation, IEEE Symposium on Computer Arithmetic, ARITH-17, Jun. 2005, pp. 196-205, XP010817723, IEEE, Piscataway, NJ, DOI: 10.1109/ARITH.2005.44, ISBN: 978-0-7695-2366-8, p. 198, left col. last para., right col. para. 3.

Taylor F J, The Application of RNS Arithmetic to Data Processing, Electronic Engineering, vol. 61, No. 750, Jun. 1989, pp. 101, 103, 104, XP000033123, Morgan-Grampian Ltd., London, GB, ISSN: 0013-4902, figs.

* cited by examiner

Example RNS Fixed Point Number System:
p = 8, f = 2, w = 2, e = 4, Q = 18
$M_j$ = {78125, 131072, 262109, 262111, 262121, 262127, 262133, 262139}
$R_F$ = 78125*131072 = 10240000000
Ex: 3216908773/$R_F$ = 3.141592653+

| | $M_1$ | $M_2$ | $M_3$ | $M_4$ | $M_5$ | $M_6$ | $M_7$ | $M_8$ | Machine Word Y | Decimal Equiv. |
|---|---|---|---|---|---|---|---|---|---|---|
| | 1312D | 20000 | 2B3FB | 3FFDF | 3FFE9 | 3FFEF | 3FFF5 | 3FFFB | | |
| | Fractional Digits | | Integer Digits | | Extended Digits | | | | | |
| | $R_1$ | $R_2$ | $R_3$ | $R_4$ | $R_5$ | $R_6$ | $R_7$ | $R_8$ | | |
| | FDFF | 1DA25 | 3505 | 3A732 | EC94 | 1AFEB | 27366 | 33705 | 3216908773 | 3.14159265+ |
| | C209 | 18923 | 17E15 | 10277 | CDD3 | 314C0 | 15BDC | 3A30B | 2783205923 | 2.71828182+ |
| | AAD1 | 1A00F | 129C7 | 18AD2 | 1C7BE | 16456 | 39629 | 129D1 | 8954603522057926479 | N/A |
| | D70 | 178E8 | 8250 | 17741 | 28DDC | 25D | 17727 | 2EC51 | 8744678440 | 8.53973422+ |
| | D70 | 178E8 | 8250 | 17741 | * | * | * | * | 8744678440 | 8.53973422+ |
| | 123BD | 8718 | 231AB | 2839E | 1720D | 3FD92 | 288CE | 113AA | 22448427036650874687413 5280514344873121560 | -8.53973422+ |
| | 0 | 0 | 4501 | 1ABFB | 3B5BF | 2229 | 8E88 | FAF3 | 1024000000 | 1.0 |
| | 1312C | 1FFFF | 4500 | 1ABFA | 3B5BE | 2228 | 8E87 | FAF2 | 1023999999 | 0.99999999+ |

Figure 7c

|  | $m_1$ 125 | $m_2$ 128 | $m_3$ 131 | $m_4$ 137 | $m_5$ 139 | $m_6$ 149 | Magnitude | Description |
|---|---|---|---|---|---|---|---|---|
|  | $d_1$ | $d_2$ | $d_3$ | $d_4$ | $d_5$ | $d_6$ | | |
| 825 → | 0 | 0 | 0 | 0 | 101 | 94 | 287152000 | M |
| 830 → | 39 | 21 | 31 | 61 | 47 | 8 | 123456789 | Y'=123456789 |
| 835 → | 39 | 21 | 31 | e=23 | 47 | 8 | 3038841376789 | RRNS Y' with error |
| 840 → | * | 21 | 31 | 23 | 47 | 8 | 41450020501 | $Y_1$ = Trial set 1 |
| 845 → | 39 | * | 31 | 23 | 47 | 8 | 18776301164 | $Y_2$ = Trial set 2 |
| 850 → | 39 | 21 | * | 23 | 47 | 8 | 42539584789 | $Y_3$ = Trial set 3 |
| 855 → | 39 | 21 | 31 | * | 47 | 8 | 123456789 | $Y_4$ = Trial set 4 |
| 860 → | 39 | 21 | 31 | 23 | * | 8 | 1060368789 | $Y_5$ = Trial set 5 |
| 865 → | 39 | 21 | 31 | 23 | 47 | * | 5367648789 | $Y_6$ = Trial set 6 |

Figure 8

| | $m_1$ 125 | $m_2$ 128 | $m_3$ 131 | $m_4$ 137 | $m_5$ 139 | $m_6$ 149 | RRNS Magnitude | Description | $\sim R_i$ $(M_i\text{-}M/2)$ | $C_i$ $(M'\text{-}M_i)$ | i |
|---|---|---|---|---|---|---|---|---|---|---|---|
| | $d_1$ | $d_2$ | $d_3$ | $d_4$ | $d_5$ | $d_6$ | | | | | |
| 1331 → | 0 | 64 | 0 | 0 | 120 | 47 | 143576000 | M/2 | | | |
| 1332 → | 0 | 0 | 0 | 0 | 0 | 0 | 5947205072000 | M' | | | |
| 1333 → | 86 | 107 | 100 | 76 | 92 | 141 | 5947081615211 | Y' = -123456789 | | | |
| 1334 → | 86 | 107 | 100 | e=23 | 92 | 141 | 3299055999211 | RRNS Y' with error | | | |
| 1335 → | * | 107 | 100 | 23 | 92 | 141 | 16198799467 | $Y_1$ = Trial set 1 | 47434064576 | 5899627431424 | 1 |
| 1336 → | 86 | * | 100 | 23 | 92 | 141 | 215685836 | $Y_2$ = Trial set 2 | 46318963625 | 5900742532375 | 2 |
| 1337 → | 86 | 107 | * | 23 | 92 | 141 | 30363135211 | $Y_3$ = Trial set 3 | 45254936000 | 5901806560000 | 3 |
| 1338 → | 86 | 107 | 100 | * | 92 | 141 | 43286799211 | $Y_4$ = Trial set 4 | 43266680000 | 5903794816000 | 4 |
| 1339 → | 86 | 107 | 100 | 23 | * | 141 | 4561103211 | $Y_5$ = Trial set 5 | 42642072000 | 5904419424000 | 5 |
| 1340 → | 86 | 107 | 100 | 23 | 92 | * | 26097503211 | $Y_6$ = Trial set 6 | 39770552000 | 5907290944000 | 6 |

Figure 13a

| | $m_1$ 125 | $m_2$ 128 | $m_3$ 131 | $m_4$ 137 | $m_5$ 139 | $m_6$ 149 | RRNS Magnitude (MRN) | Description | $\sim R_i$ $(M_i-M/2)$ MRN format | $c_i$ $(M'-M_i)$ RNS format |
|---|---|---|---|---|---|---|---|---|---|---|
| | $d_1$ | $d_2$ | $d_3$ | $d_4$ | $d_5$ | $d_6$ | | | | |
| 1376 → | 0 | 64 | 0 | 0 | 120 | 47 | <0,64,65,68,0,0> | M/2 | | |
| 1377 → | 0 | 0 | 0 | 0 | 0 | 0 | <0,0,0,0,0,0> | M' | | |
| 1378 → | 86 | 107 | 100 | 76 | 92 | 141 | <86,121,12,78,138,148> | Y' = -123456789 | | |
| 1379 → | 86 | 107 | 100 | e=23 | 92 | 141 | <86,121,12,121,90,82> | RRNS Y' with error | | |
| 1380 → | * | 107 | 100 | 23 | 92 | 141 | <*,107,46,67,101,50> | $Y_1$ = Trial set 1 | <*,64,65,68,76,148> | {49,0,0,0,0,0} |
| 1381 → | 86 | * | 100 | 23 | 92 | 141 | <86,*,85,19,96,0> | $Y_2$ = Trial set 2 | <0,*,0,0,75,148> | {0,23,0,0,0,0} |
| 1382 → | 86 | 107 | * | 23 | 92 | 141 | <86,121,*,108,90,99> | $Y_3$ = Trial set 3 | <0,64,*,68,73,148> | {0,0,37,0,0,0} |
| 1383 → | 86 | 107 | 100 | * | 92 | 141 | <86,121,12,*,80,148> | $Y_4$ = Trial set 4 | <0,64,65,*,70,148> | {0,0,0,71,0,0} |
| 1384 → | 86 | 107 | 100 | 23 | * | 141 | <86,121,12,121,*,15> | $Y_5$ = Trial set 5 | <0,64,65,68,*,148> | {0,0,0,0,102,0} |
| 1385 → | 86 | 107 | 100 | 23 | 92 | * | <86,121,12,121,90,*> | $Y_6$ = Trial set 6 | <0,64,65,68,138,*> | {0,0,0,0,0,46} |

Figure 13b

| Stage | $R_1$ $a_1$ | $R_2$ $a_2$ | $R_3$ $a_3$ | $R_4$ $a_4$ | $R_5$ $a_5$ | $R_6$ $a_6$ | cs+ | $a_i$ | cs- | $b_i$ | $p_i$ | $R_4$ | $C_4$ |
|---|---|---|---|---|---|---|---|---|---|---|---|---|---|
| Start | 86 | 107 | 100 | * | 92 | 141 | = | 0 | = | 0 | 1 | | |
| STAGE 1 | - | 121 | 85 | * | 79 | 66 | > | 64 | > | 64 | 125 | 86 | |
| STAGE 2 | - | - | 12 | * | 67 | 31 | > | 65 | > | 65 | $\lfloor 125*128 \rfloor_{m4}$ | 4 | |
| STAGE 3 | - | - | - | * | * | * | * | * | * | * | * | * | |
| STAGE 4 | - | - | - | - | 80 | 90 | < | 68 | < | 70 | $\lfloor 125*128*131 \rfloor_{m4}$ | 67 | |
| STAGE 5 | - | - | - | - | - | 148 | > | 0 | > | 148 | $\lfloor 125*128*131*139 \rfloor_{m4}$ | 13 | |
| STAGE 6 | - | - | - | - | - | - | > | | > | | | 5 | 71 |
| | | | | | | | | | | | | 76 | |

Original RRNS value (> M' - M/2) = {86, 107, 100, 76, 92, 141} = -123456789₁₀
Example: Trial digit set $Y_4$ = {86, 107, 100, *, 92, 141} = -123456789₁₀    (<MRN> read least significant digit first)

<86, 121, 12, *, 80, 148> is greater than <0, 64, 65, *, 68, 0>
→ $Y_4$ is not legal positive value. [1692]

<86, 121, 12, *, 80, 148> is greater than <0, 64, 65, *, 70, 148>
→ $Y_4$ is a legal negative value. [1693]

→ After Base Extend function:
$R_4$ = (86*1+121*(125)+12*(125*128)+80*(125*128*131)+148*(125*128*131*139)) % 137 = 5

→ After digit correction, $R_4$ is recovered:
$R_4$ = 5 + 71 = 76

Figure 16b

| es₁ | es₂ | es₃ | es₄ | es₅ | es₆ | # of trial sets passing | Type of pass (es code) | EDAC Action | Error Condition | Error Code output |
|---|---|---|---|---|---|---|---|---|---|---|
| 1 | 1 | 1 | 1 | 1 | 1 | All $Y_i$ | $Y_i < M/2$ positive value | Y' is passed | No error in Y' | 000 |
| 0 | 0 | 0 | 1 | 0 | 0 | One and only one $Y_i$ | $Y_i < M/2$ positive value | Y' is corrected with base extended $d_i$ | Single digit in Y' corrected | 001 |
| 2 | 2 | 2 | 2 | 2 | 2 | All $Y_i$ | $Y_i > \sim R_i$ negative value | Y' is passed | No error in Y' | 010 |
| 0 | 0 | 0 | 2 | 0 | 0 | One and only one $Y_i$ | $Y_i > \sim R_i$ negative value | Y' is corrected with $d_i = d_i + C_i$ | Single digit in Y' corrected | 011 |
| 0 | 0 | 0 | 0 | 0 | 0 | No $Y_i$ | $Y_i < M/2$ or $Y_i > \sim R_i$ | Y' is improperly corrected | Un-corrected error | 100 |
| 0 | 2 | 0 | 1 | 1 | 0 | 1 < (# of $Y_i$) < p | $Y_i < M/2$ or $Y_i > \sim R_i$ | Y' is improperly corrected | Un-corrected error | 101 |

Example (es) codes

EDAC error function decision table - f(x)

es_i input signal code
0 = $Y_i$ is out of legal range
1 = $Y_i$ is a legal positive value
2 = $Y_i$ is a legal negative value

Figure 19

| | $m_1$ 125 | $m_2$ 128 | $m_3$ 131 | $m_4$ 137 | $m_5$ 139 | $m_6$ 149 | RRNS Magnitude (MRN) | Description | M/2 MRN format | $\tilde{R}_i$ $(M_i\text{-}M/2)$ MRN format | $c_i$ $(M'\text{-}M_{ij})$ RNS format |
|---|---|---|---|---|---|---|---|---|---|---|---|
| | | | | | | | | | 2220 | 2225 | 2230 |
| | | | | | | | 2210 | 2215 | | | |
| | | | | | | | | | | | |
| | | | | $d_1$ | $d_2$ | $d_3$ | $d_4$ | $d_5$ | $d_6$ | | | | | |
| 2231 → | 0 | 64 | 0 | 0 | 120 | 47 | <0,64,65,68,0,0> | M/2 | | | |
| 2232 → | 0 | 0 | 0 | 0 | 0 | 0 | <0,0,0,0,0,0> | M' | | | |
| 2233 → | 39 | 21 | 31 | 61 | 47 | 8 | <39,6,118,58,0,0> | Y' = 123456789 | | | |
| 2234 → | 39 | 21 | 31 | e=23 | 47 | 8 | <39,6,118,94,18,76> | RRNS Y' with error | | | |
| 2235 → | * | 21 | 31 | 23 | 47 | 8 | <*,21,84,80,112,129> | $Y_1$ = Trial set 1 | <*,64,65,68,62,0> | <*,64,65,68,76,148> | {49,0,0,0,0,0} |
| 2236 → | 39 | * | 31 | 23 | 47 | 8 | <39,*,45,91,29,60> | $Y_2$ = Trial set 2 | <0,*,0,0,64,0> | <0,*,0,0,75,148> | {0,23,0,0,0,0} |
| 2237 → | 39 | 21 | * | 23 | 47 | 8 | <39,6,*,102,85,139> | $Y_3$ = Trial set 3 | <0,64,*,68,65,0> | <0,64,*,68,73,148> | {0,0,37,0,0,0} |
| 2238 → | 39 | 21 | 31 | * | 47 | 8 | <39,6,118,*,58> | $Y_4$ = Trial set 4 | <0,64,65,*,0> | <0,64,65,*,70,148> | {0,0,0,71,0,0} |
| 2239 → | 39 | 21 | 31 | 23 | * | 8 | <39,6,118,94,*,3> | $Y_5$ = Trial set 5 | <0,64,65,68,*,0> | <0,64,65,68,*,148> | {0,0,0,0,102,0} |
| 2240 → | 39 | 21 | 31 | 23 | 47 | * | <39,6,118,94,18,*> | $Y_6$ = Trial set 6 | <0,64,65,68,0,*> | <0,64,65,68,138,*> | {0,0,0,0,0,46} |

$Y_4 = <39,6,118,*,58>$ less than $<0,64,65,*,68>$ (<MRN> listed least significant digit first)
→ positive value with one digit $d_4$ in error
→ BE({39,21,31,*,47,8}) = {39,21,31,61,47,8}    (value recovered)

Figure 22a

| | $m_1$ 125 | $m_2$ 128 | $m_3$ 131 | $m_4$ 137 | $m_5$ 139 | $m_6$ 149 | Description | RRNS Magnitude (MRN) | M/2 MRN format | ~$R_i$ $(M_i-M/2)$ MRN format | $C_i$ $(M'-M_i)$ RNS format |
|---|---|---|---|---|---|---|---|---|---|---|---|
| | $d_1$ | $d_2$ | $d_3$ | $d_4$ | $d_5$ | $d_6$ | | | | | |
| 2281 → | 0 | 64 | 0 | 0 | 120 | 47 | M/2 | <0,64,65,68,0,0> | | | |
| 2282 → | 0 | 0 | 0 | 0 | 0 | 0 | M' | <0,0,0,0,0,0> | | | |
| 2283 → | 86 | 107 | 100 | 76 | 92 | 141 | Y' = -123456789 | <86,121,12,78,138,148> | | | |
| 2284 → | 86 | 107 | 100 | e=23 | 92 | 141 | RRNS Y' with error | <86,121,12,121,90,82> | | | |
| 2285 | * | 107 | 100 | 23 | 92 | 141 | $Y_1$ = Trial set 1 | <*,107,46,67,101,50> | <*,64,65,68,62,0> | <*,64,65,68,76,148> | {49,0,0,0,0,0} |
| 2286 | 86 | * | 100 | 23 | 92 | 141 | $Y_2$ = Trial set 2 | <86,*,85,19,96,0> | <0,*,0,0,64,0> | <0,*,0,0,75,148> | {0,23,0,0,0,0} |
| 2287 | 86 | 107 | * | 23 | 92 | 141 | $Y_3$ = Trial set 3 | <86,121,*,108,90,99> | <0,64,*,68,65,0> | <0,64,*,68,73,148> | {0,0,37,0,0,0} |
| 2288 | 86 | 107 | 100 | * | 92 | 141 | $Y_4$ = Trial set 4 | <86,121,12,*,80,148> | <0,64,65,*,68> | <0,64,65,*,70,148> | {0,0,0,71,0,0} |
| 2289 | 86 | 107 | 100 | 23 | * | 141 | $Y_5$ = Trial set 5 | <86,121,12,121,*,15> | <0,64,65,68,*,0> | <0,64,65,68,*,148> | {0,0,0,0,102,0} |
| 2290 | 86 | 107 | 100 | 23 | 92 | * | $Y_6$ = Trial set 6 | <86,121,12,121,90,*> | <0,64,65,68,0,*> | <0,64,65,68,138,*> | {0,0,0,0,0,46} |

$Y_4$ = <86,121,12,*,80,148> greater than <0,64,65,*,70,148> (<MRN> read least significant digit first)
→ Y' is negative with $d_4$ digit in error
→ BE({86,107,100,*,92,141}) = {86,107,100,5,92,141}
→ Y = {86,107,100,5,92,141} + {0,0,0,71,0,0} = {86,107,100,76,92,141} (value recovered)

Figure 22b

RESIDUE NUMBER SYSTEMS AND METHODS FOR ARITHMETIC ERROR DETECTION AND CORRECTION

BACKGROUND OF THE INVENTION

1. Field of the Invention

The invention relates to error detection and correction and in particular to residue number systems and methods for arithmetic error detection and correction.

2. Related Art

Error detection and correction is a well-known topic in science, mathematics and engineering. Error detection and correction is often used to detect and possibly correct errors in the storage and transmission of data. For example, Hamming codes are used to detect errors in data transmission, while parity codes are used to detect and correct bit errors in storage of data.

From the discussion that follows, it will become apparent that the present invention addresses the deficiencies associated with the prior art while providing numerous additional advantages and benefits not contemplated or possible with prior art constructions.

SUMMARY OF THE INVENTION

This disclosure introduces a new and novel approach to error detection and correction of arithmetic which uses the residue number arithmetic instead of binary arithmetic. The specific residue number system (RNS) used is a carry free number system that supports signed fixed-point arithmetic. This new version of RNS fixed-point arithmetic is disclosed in U.S. Pat. No. 9,081,608, which is incorporated herein by reference.

One area of error detection and correction not as well-known is the error detection and correction of arithmetic. Error detection and correction (EDAC) of arithmetic has some theoretical basis and has been studied in the prior art, but very few implementations are known to exist in the marketplace. The reason is that the process of arithmetic manipulates the data that is applied, and therefore the error code itself must undergo a similar or exact manipulation as well, so that the result and the error code have equivalence, i.e., they share some amount of redundancy before and after an arithmetic transformation. Thus, the redundancy of the arithmetic result and error correction code form the basis for EDAC. Such methods have not flourished in the prior art because of the complexity and limitations of prior art circuitry required to perform EDAC of binary arithmetic.

To attempt to avoid this complication, one alternative prior art approach for performing error detection and correction of arithmetic is so called "triplication" of computer systems. In a basic triplication example of FIG. 1, three computers ALU's 100,115,120 are operated in tandem processing identical input data operands A 105 and B 110. Typically, a voting circuit 125 monitors the output of each ALU and determines if there is any disagreement. If one computer disagrees with the other two, then the best two out of three answer is selected and returned as the result R 130. An error signal 135 may be generated to indicate an error is detected and corrected; however, if all three ALU's disagree, an "un-recoverable" error signal 140 may be generated.

While a triplication scheme sounds simple, it is typically not trivial to implement. For example, once an error is detected, it may be necessary to reboot the computer in error and re-synchronize it with the other two. This is not trivial in real-time applications. But the main drawback of triplication is the need for three independent ALU or computer systems; this makes error detection and correction of arithmetic expensive and it increases the delay, resources and latency of the ALU, thus significantly penalizing the performance of the ALU in high-speed applications.

One prior art approach to error detection and correction of arithmetic uses the residue number system (RNS) to perform arithmetic. There are several unique properties of RNS which allow for unique opportunities to perform error detection and correction of arithmetic. For one, unlike conventional EDAC schemes such as Hamming codes or parity codes, there is no difference between a single bit error in an RNS digit or multiple bit errors in the same digit; in both cases, the RNS digit is incorrect. Therefore, in RNS based error detection and correction, it is more common to discuss "digit errors", and the number of digits in error for any given representation.

For another, since RNS arithmetic is carry free, single bit errors in one digit do not propagate to other RNS digits. For the case of binary arithmetic, it is likely that an error in a single bit position will affect bits of other significance or position. In the case of basic RNS arithmetic, a single digit modulus in error will remain isolated since there is no transmission of information from one RNS digit modulus to another during the operations of addition, subtraction and multiplication. Therefore, there are distinct differences between binary error detection and RNS error detection, and fundamentally, RNS EDAC solutions involve the detection and correction of RNS digits in error, not singular bits.

There are other distinct differences between an EDAC solution utilizing a binary data representation versus an RNS data representation. In the case of binary Hamming codes for example, there is the concept of "distance", called Hamming distance, which is the minimum number of errors that could have transformed one string of bits to another. Also, there is the prior art notion of Hamming weight, which is the number of 1's that transform a zero value to a data value. These notions are vital in the case of binary representation EDAC but have less meaning in RNS based EDAC systems.

For example, with RNS EDAC it is feasible to perform integer arithmetic indefinitely with one digit in error while retaining the full integrity of the arithmetic. Therefore, the concept of "error detection distance" differs significantly. In practice, there is some limit typically placed on a series of integer additions, subtractions and multiplications. After any such length of integer arithmetic operations, an EDAC cycle can be performed afterwards on the arithmetic result to detect and correct digit errors.

When fixed-point arithmetic is performed, a normalization operation is performed which allows information from one digit to affect other digits. However, the process of the arithmetic normalization is completely linear in arithmetic, and it's result is expected to be in a valid range, so that the result of fixed-point normalization may also be checked and corrected by an RNS based EDAC unit.

To summarize, with RNS arithmetic, it is possible that a lengthy series of integer arithmetic operations result in a single digit in error, but this error can be detected and even corrected. Furthermore, in RNS fixed-point arithmetic, a normalized fixed-point arithmetic result is testable by the EDAC, and if a single digit error is detected, it is can be corrected. This type of performance appears not possible or at least very difficult using binary arithmetic and represents a significant break-through in computer science and mathematics.

One of the chief advantages of RNS over binary arithmetic is the RNS representation itself may be fully redundant. In fact, it is possible to devise redundant RNS representations, called RRNS for short. In an RRNS, there are more RNS digits then necessary to represent a given data word. Because RNS is not a weighted number system, this allows the RRNS the property that any one or more digits can be ignored without affecting the value of the data represented. This provides a significant type of redundancy not present in a weighted number system, like binary. Moreover, the redundancy is "built in", and not simply attached as a separate code, as is the case with many EDAC schemes.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 7c is a diagram of a tabulated table indicating example RNS fixed-point data values;

FIG. 8 is a diagram of a tabulated table illustrating a positive RRNS value, the same RRNS value in error, and the associated trial digit combinations for detecting the error;

FIG. 13a is a tabulated table illustrating an example error detection and correction of a negative data value represented in a complement-M' signed RRNS representation with magnitudes and constants listed in decimal number format;

FIG. 13b is a tabulated table illustrating an example error detection and correction of a negative data value represented in a complement-M' signed RRNS representation with magnitudes and constants listed in mixed-radix number format;

FIG. 16b is a tabulated table illustrating an example error detection and correction calculation for a single digit of a negative RRNS data value;

FIG. 19 is a tabulated table illustrating an exemplary logic function for error detection and correction circuit.

FIG. 22a is a tabulated table illustrating an example error detection and correction calculation for a positive RRNS word; and FIG. 22b is a tabulated table illustrating an example error detection and correction calculation for a negative RRNS word.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

RNS EDAC

Theoretically, it has been shown that detection of arithmetic errors will require the use of arithmetic codes (AR-codes), or residue (remainder) codes. A prior art proof illustrates this concept. However, there are several approaches to utilizing AR codes or residue codes in the prior art. While it is not the intent to fully describe each type, it is necessary to discuss a few basic residue-based EDAC's to establish a basis for a thorough discussion of the inventions and novel methods described herein.

Figure 2:
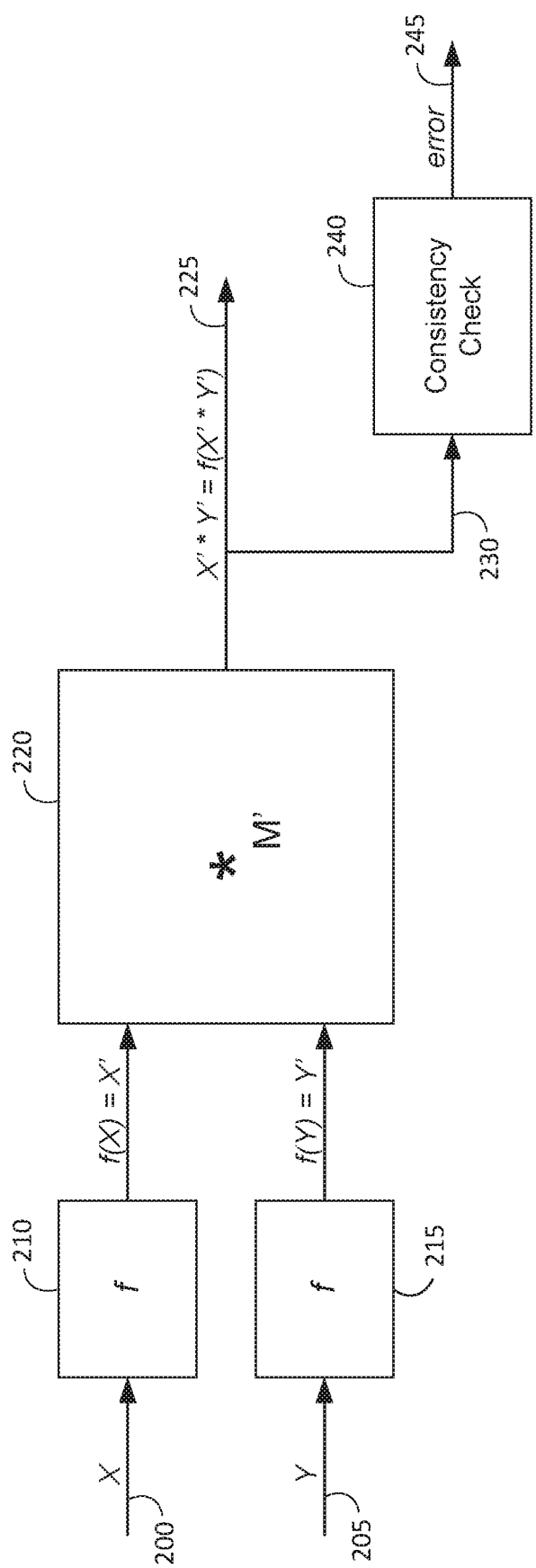
FIG. 2 is a block diagram of an error detection circuit using non-separate, non-systematic codes.
Figure 3:
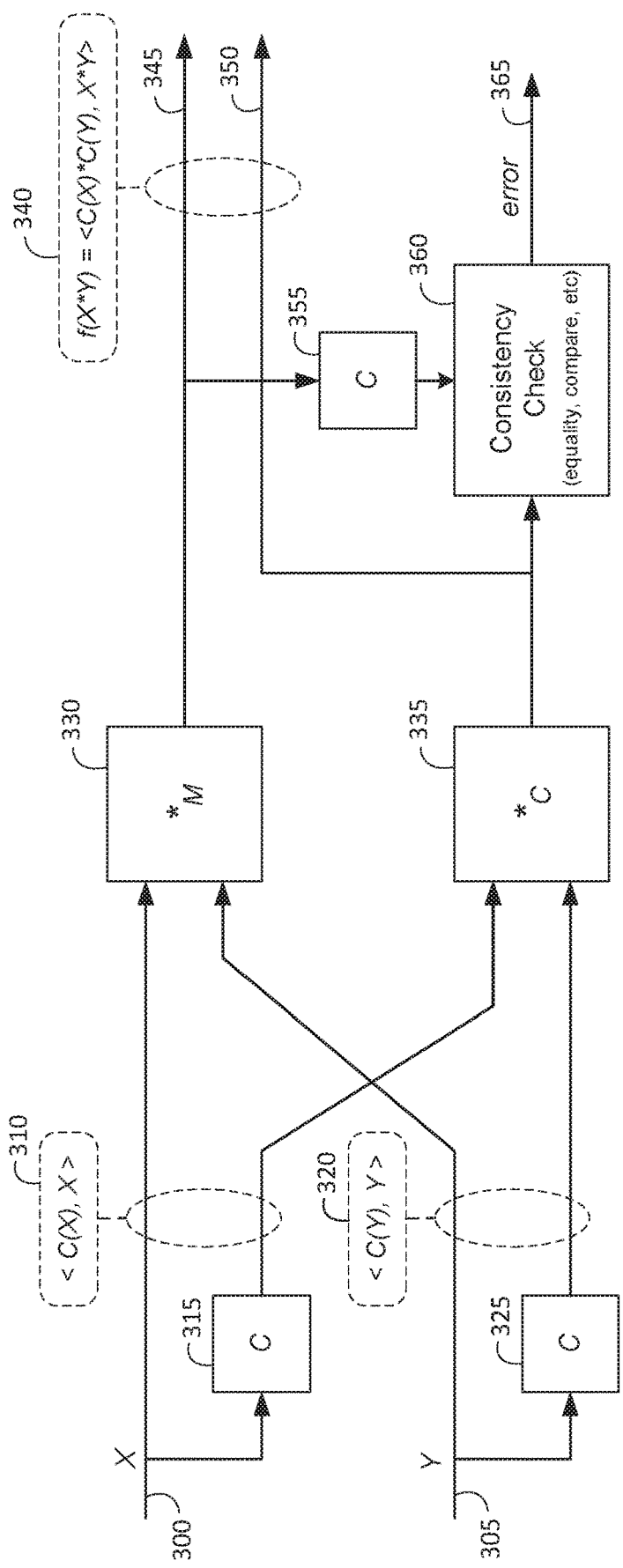
FIG. 3 is a block diagram of an error detection circuit using separate, systematic codes.

RNS EDAC methods of the prior art typically belong in one of two primary categories, 1) EDAC's with non-separate codes, which are further characterized as non-systematic as shown in FIG. 2, and 2) EDAC's with separate codes, which are further characterized as systematic as shown in FIG. 3.

Figure 4A:
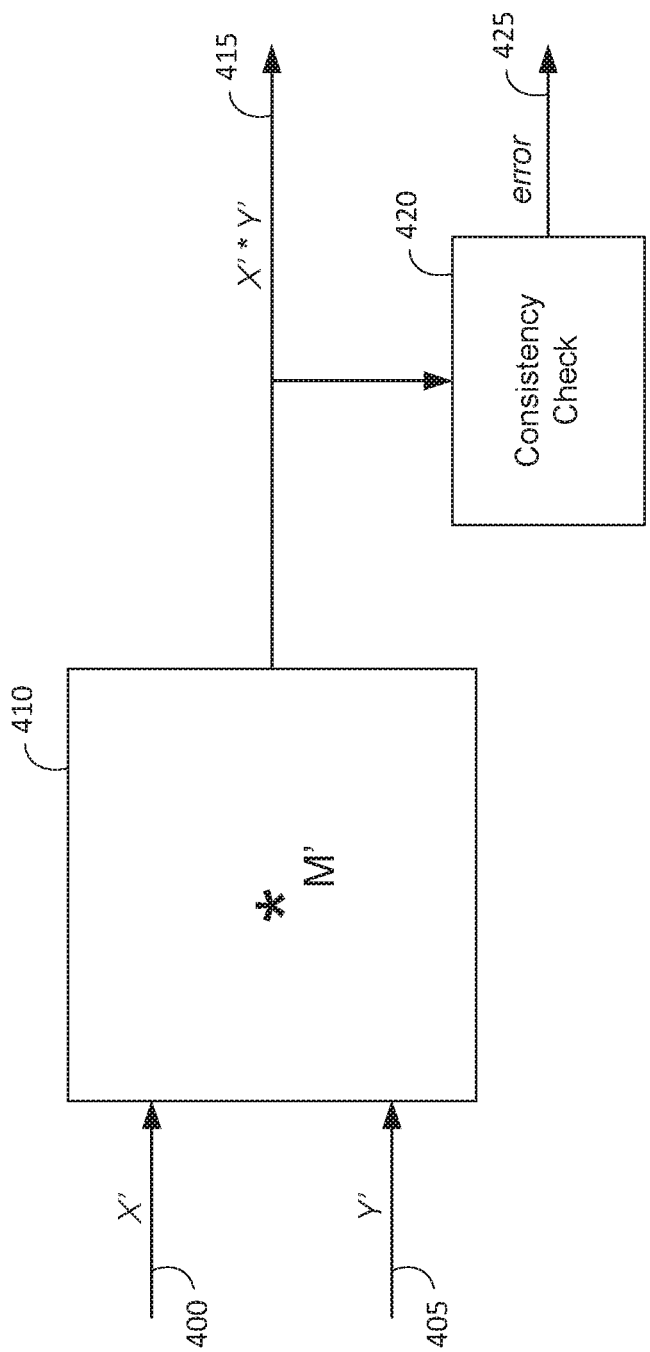
FIG. 4a is a block diagram of an error detection circuit using a consistency check.

An example of a non-systematic RRNS EDAC system for arithmetic of positive integers is shown as a basic block diagram in FIG. 4a. The arithmetic ALU or specific arithmetic function 410 is shown with an asterisk (*) which denotes any arithmetic operation(s) while the M' suffix denotes the arithmetic space of the RRNS word size. The RRNS EDAC system detects errors in arithmetic after two operands X' and Y' represented in an RRNS are directly processed using ALU 410 providing an RRNS result 415 as expected. The (non-systematic) redundancy of the RRNS result provides a self-checking capability such that a data consistency check 420 is used to detect and generate an error signal 425 when an illegal representation is detected. This scheme works in RRNS since it can be shown that one or more incorrect RRNS digits result in an illegal representation provided certain conditions are met.

Figure 4B:
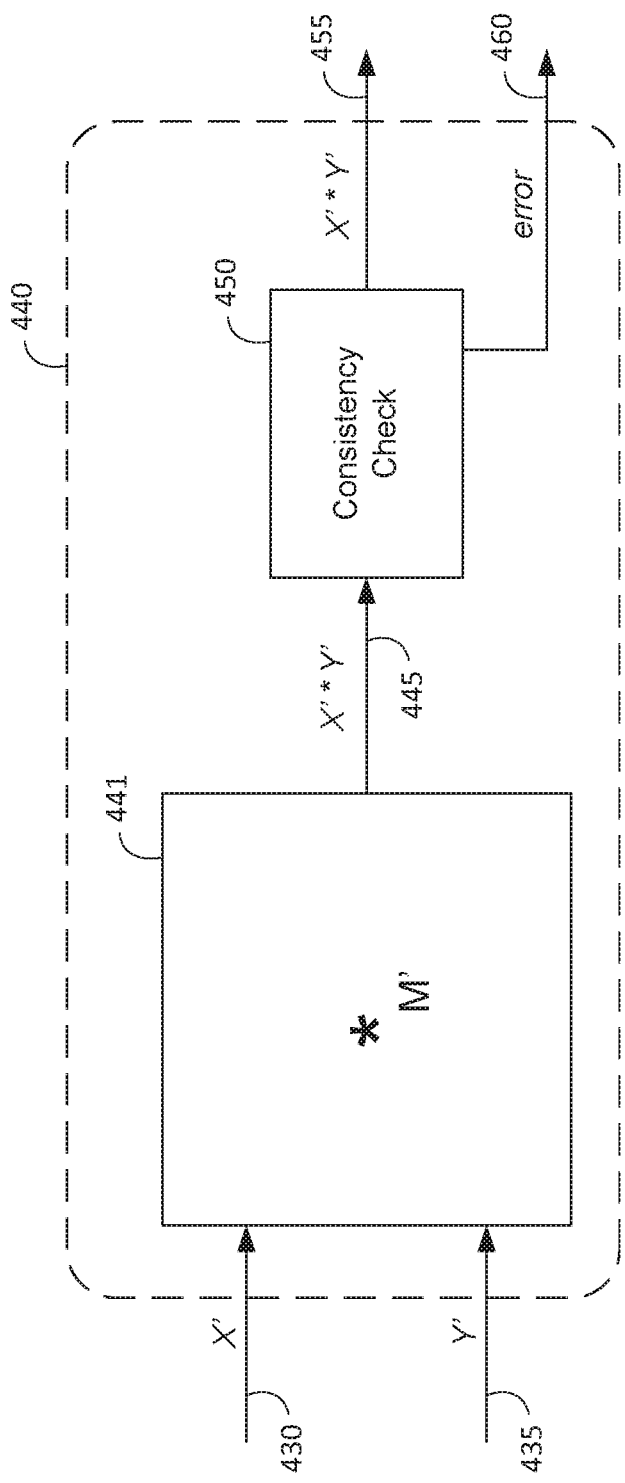
FIG. 4b is a block diagram of an error detection circuit illustrating pipelined flow of arithmetic results.

There are many other attributes of a prior art EDAC system that will be briefly mentioned. For example, the EDAC system of FIG. 4a may be implemented as a software solution or alternatively as a micro-coded solution in a CPU, or as a hardware-based solution. Moreover, the EDAC error checking process may be initiated after a certain number of arithmetic instructions have been performed, or alternatively may be initiated in a continuous, self-checking mode. For example, the block diagram of FIG. 4b shows the EDAC circuit of FIG. 4a re-organized into a self-checking, error detecting ALU 440. In FIG. 4b, the consistency check unit 450 accepts the result 445 of the ALU 441 on every operation. If an error is detected in any ALU operation, an error signal 460 is generated. The consistency check unit 450 may pass a correct result (X'*Y') via output port 455 when no error is detected, and may pass another value, for example the value zero, via output port 455 if an error is detected.

Figure 5A:
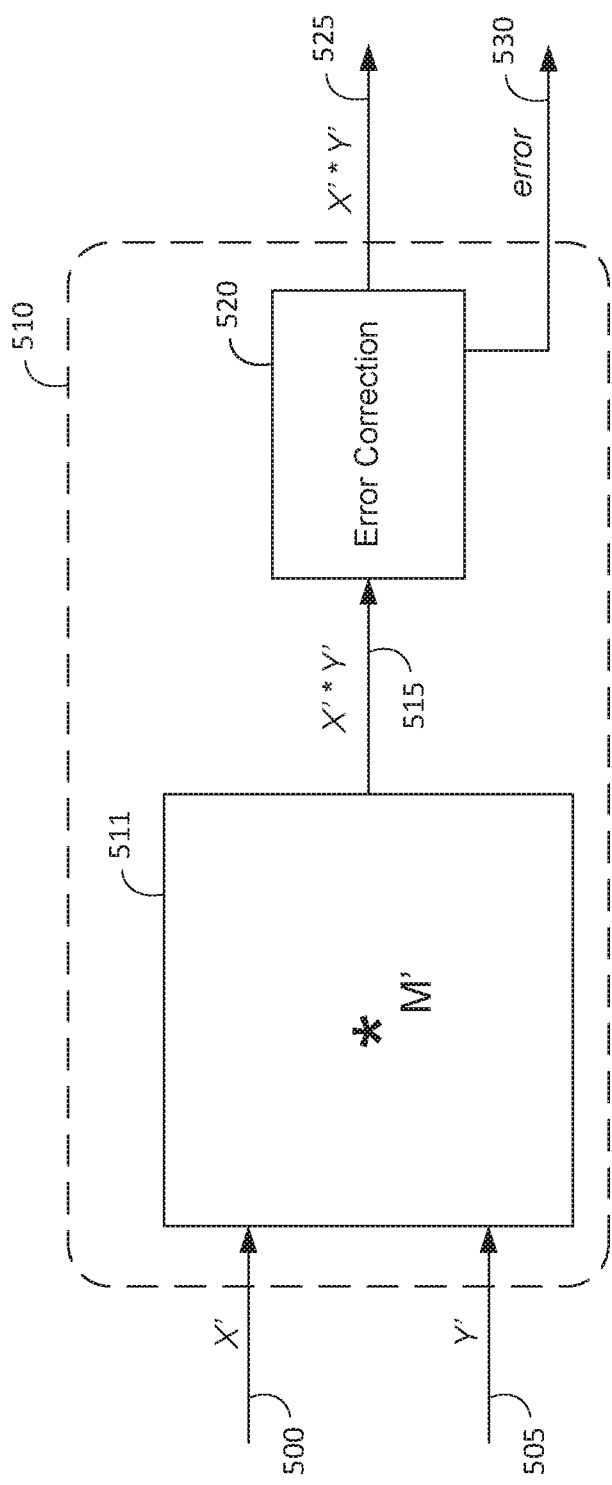
FIG. 5a is a block diagram of an exemplary error correction circuit illustrating continuous pipelined flow of corrected arithmetic results.

The block diagram of FIG. 5a illustrates a basic preferred embodiment for an automatic error corrected ALU 510. As shown, two signed operands X' 500 and Y' 505 is processed by an arithmetic operation (*) using ALU 511 providing an arithmetic result (X'*Y') 515; the arithmetic result 515 is then sent to an error correction unit 520 so a digit detected in error is corrected automatically and in a continuous manner, and so that a corrected result X'*Y' is transmitted via port 525. In tandem to the error correction unit output 525 is the error detection signal 530 which may indicate the condition of no-error, corrected error or un-corrected error for each operation.

The block diagram of an auto-correcting ALU 510 of FIG. 5a is simplified, and may even appear obvious, but such a streamlined RRNS solution does not exist in the prior art. The main reason for this is the problem of detecting and correcting errors on signed RRNS arithmetic, particularly arithmetic resulting in a negative RRNS value. The reasons for this will be explored shortly. However, the unique and novel methods and apparatus disclosed herein support the full range of RNS arithmetic using signed RRNS operands and provide an un-precedented capability for performing continuously checked and corrected arithmetic on fully signed arithmetic results. The block diagram of FIG. 5a may represent any type of RNS based ALU application, including the high-speed pipelined circuits to be disclosed herein.

Figure 5B:
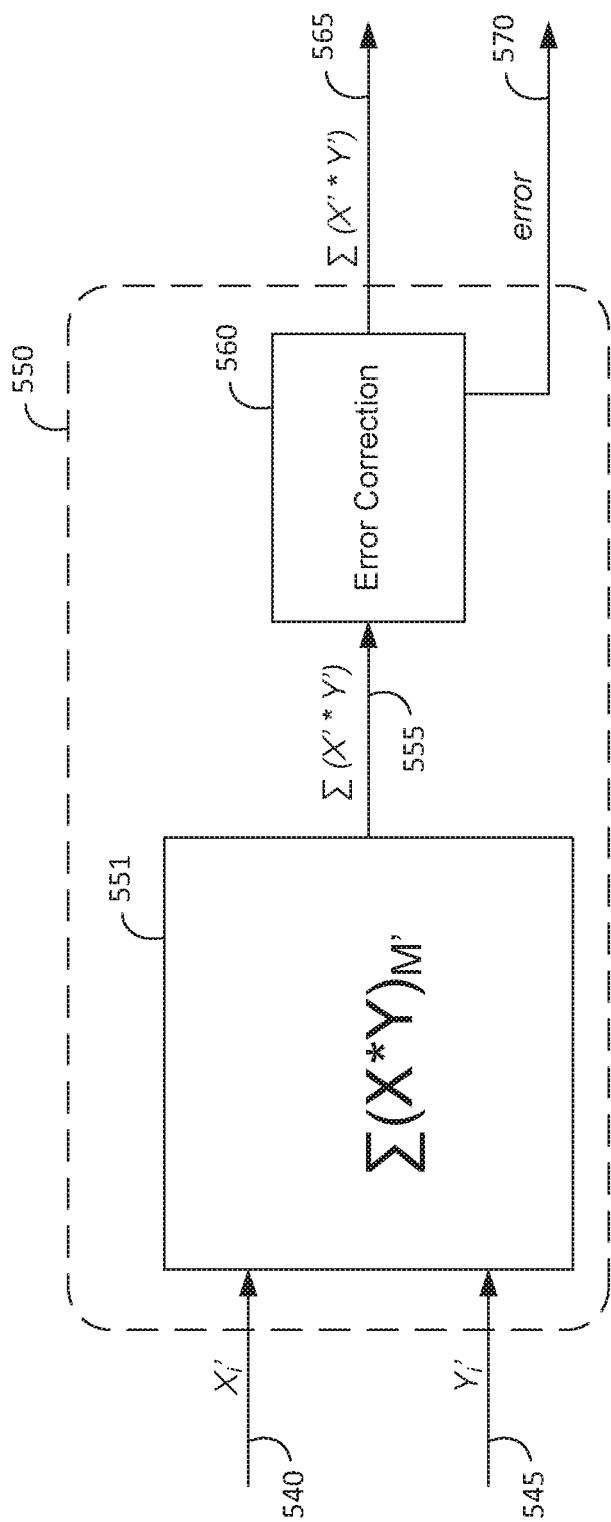
FIG. 5b is a block diagram of an exemplary error correction circuit illustrating continuous pipelined flow of corrected product summation results.

Another preferred embodiment of the methods of the present invention are illustrated in the block diagram of FIG. 5b. Depending on the application, an error correcting unit 560 may be utilized at various stages of processing without degrading the ability to correct RNS digits in error. For example, in FIG. 5b, a plurality of signed operands, $X_i'$ 540 and $Y_i'$ 545, are multiplied and their product summed using product summation unit 551. During product summation in unit 551 no error detection or correction is performed. However, after product summation is complete, a product summation 555 is transmitted to an error correction unit 560 so that any RRNS digit in error may be detected and corrected automatically and continuously and without impeding the flow of high-speed data processing, which is especially important for pipelined implementation.

The ability to organize RRNS product summation as illustrated in FIG. 5b allows high-speed matrix multiplier designs to effectively utilize continuous and automatic error checking using the methods of the present invention. For example, as illustrated by the block diagram of FIG. 6a, a high-speed hardware matrix multiplier 610a is comprised of a plurality of product summation units, such as product summation unit 615. Matrix data in RRNS format stored in row buffers 605a and column buffers 600a are multiplied together to produce a product matrix stored in result buffers 630. Dot products (product summations) generated by each product summation unit 615 exit the hardware matrix multiplier 610a using readout buses, such as readout bus 617, and are transmitted to an error detection and correction unit, such as EDAC unit 620a. After being corrected for possible errors, corrected dot product data is normalized using a pipelined normalize unit 625a so that its format is returned to the format of the operands (fixed-point normalization).

Figure 6A:
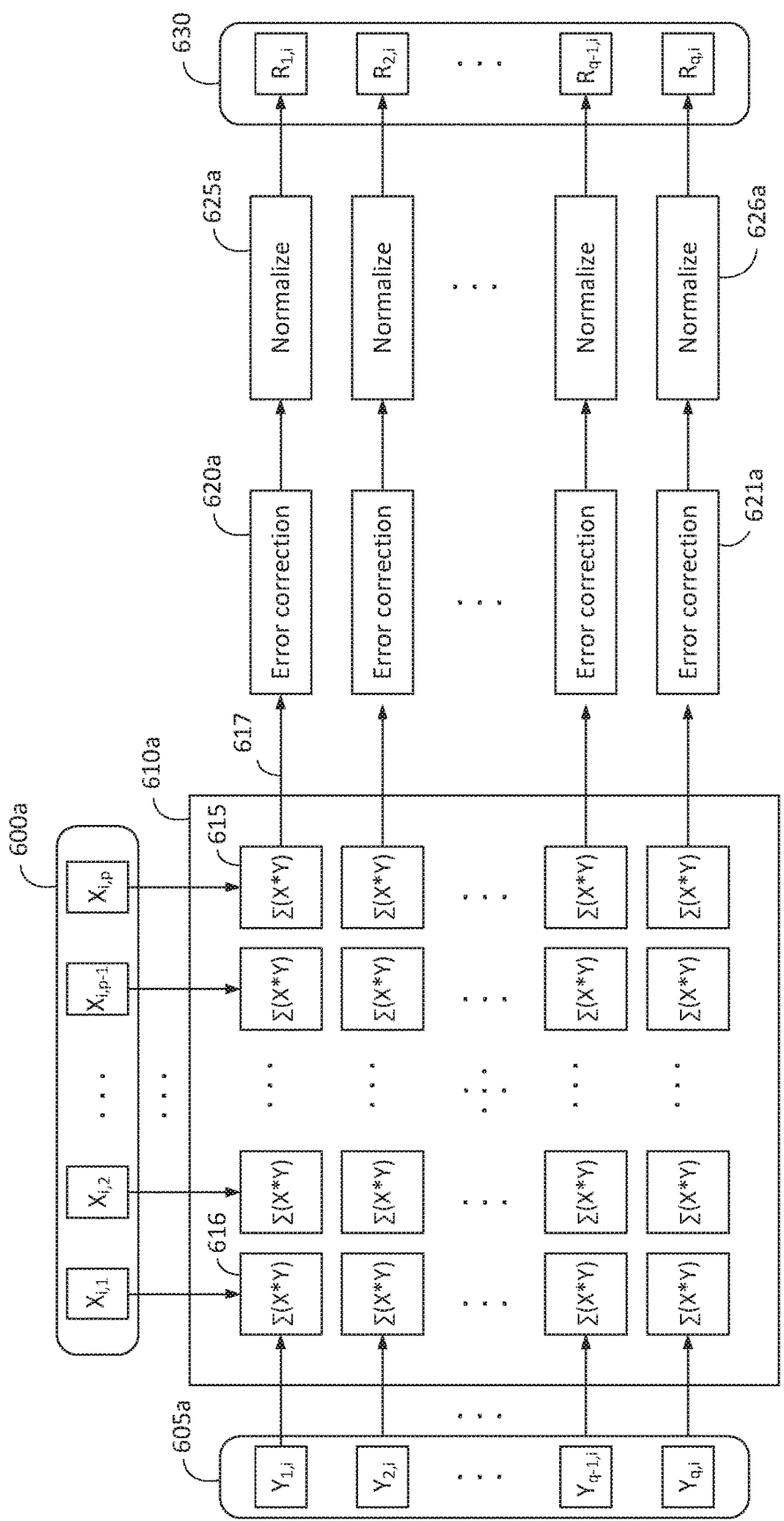
FIG. 6a is a block diagram of an exemplary hardware matrix multiplier with continuous pipelined flow of error corrected dot products.
Figure 6B:
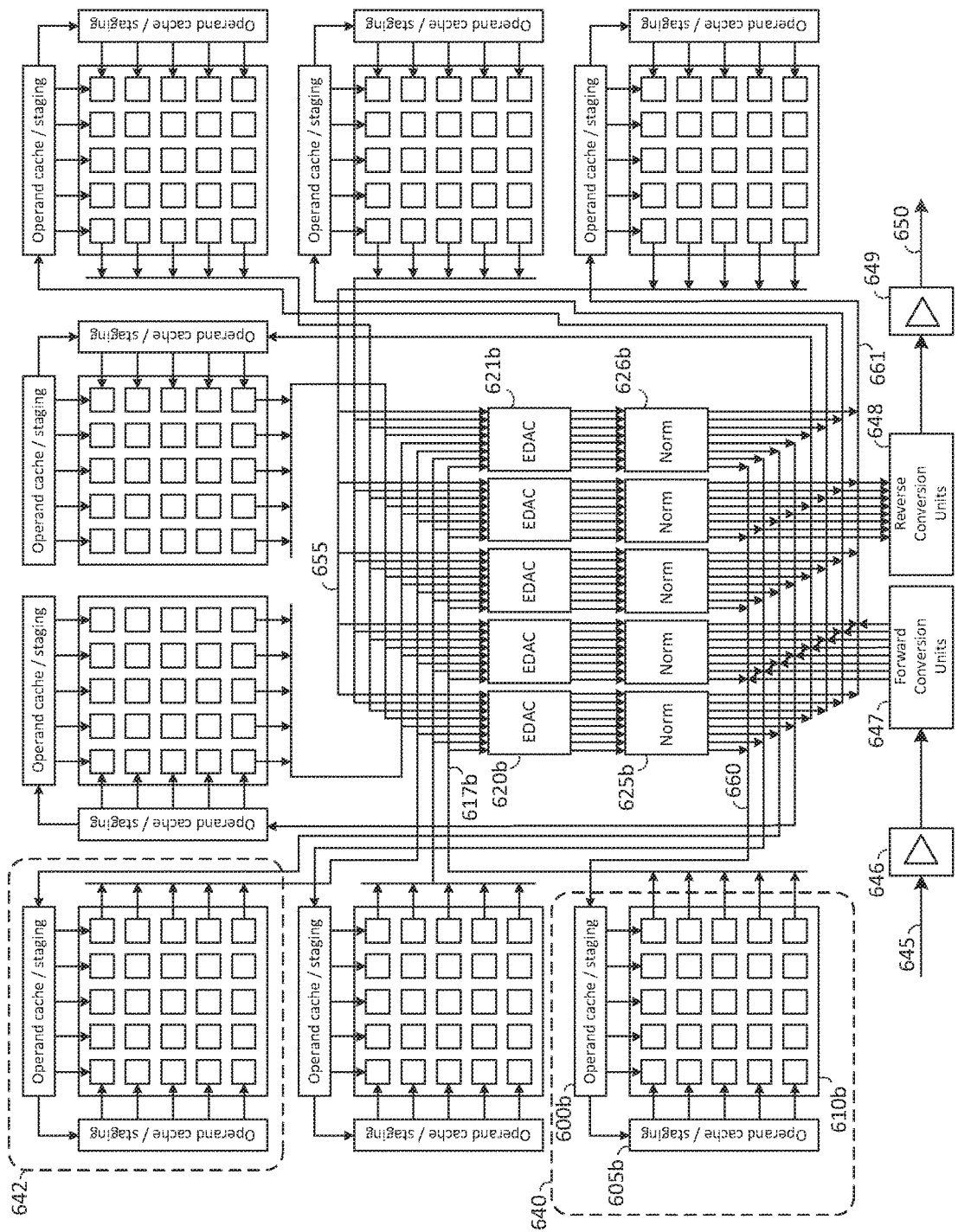
FIG. 6b is a block diagram of an exemplary RNS hardware matrix multiplier with separated digit matrix multipliers and continuous pipelined flow of error corrected dot products.

The RNS based hardware matrix multiplier example of FIG. 6a is redrawn with more detail in FIG. 6b to further illustrate how the EDAC of the present invention is integrated into high performance RNS based matrix multiplication by means of example. Since product summation of RRNS operands is carry free, the RNS based hardware matrix multiplier of FIG. 6b is partitioned into a plurality of "digit matrix multipliers", such as digit matrix multipliers 640, 642. By means of example, FIG. 6b shows eight "digit matrix multipliers" representing a total RRNS word-size of 8 digits. In general, by operating enough digit matrix multipliers in tandem, a suitably sized RRNS word is supported.

The partitioning of RRNS digits results in many advantages including fast operation since each digit matrix multiplier is synthesized using narrow, high-speed modular multipliers and accumulators. However, for the purpose of error detection and correction, the physical separation of each RRNS digit into its own matrix multiplier has significant advantages. Consider if a clocking error occurs in a single digit matrix multiplier, it may alter many dot products of a matrix product result; however, because the error remains isolated to a single RRNS digit modulus, the entire matrix product result can be recovered.

In space-based applications of AI acceleration, the impact of high-energy neutrons may adversely affect a single dot product of a single digit matrix multiplier of FIG. 6b; even if a plurality of single dot product errors are impacted through all digit matrix multipliers simultaneously, and provided that no two or more matrix dot-product locations are affected between digit matrix multipliers, the result of the matrix product can be recovered using single digit error correction. As seen, the advantage of combining single digit error correction to a physical ALU which partitions and isolates each digit of an ALU, a significant reliability in terms of detecting and correcting arithmetic is achieved.

Referring to FIG. 6b, once product summation is complete, each digit matrix multiplier transfers an intermediate product summation to a series of EDAC units, such as EDAC units 620b, 621b. In FIG. 6b and by means of example, each EDAC unit services an entire matrix row of the which there is a total of five. In this example, each row of digit matrix multiplier 640 transfers it's intermediate product summations via bus 617b to a series of error detection and correction units 620b, 621b. All other digit matrix multipliers contribute a product summation for each RRNS digit and each digit of each RRNS product summation word is typically input in synchronization to the EDAC units.

In FIG. 6b, each EDAC unit 620b, 621b will check a fully assembled RRNS word for integrity. If the RRNS word is in error, it may be because one of a plurality of digit matrix multipliers, such as digit matrix multiplier 642, has resulted in an arithmetic error. If so, the EDAC units 620b, 621b detect the RRNS digit in error and correct the RRNS digit in error before the process of signed product normalization is performed by a series of normalize units, such as normalize units 625b, 626b.

The significance of hardware matrix multiplication of FIG. 6b to the methods of error detection and correction of the present invention is that many common circuit errors may be isolated and corrected in an expedient and effective manner. For example, consider one of the most common types of digital errors is a result of faulty clocking. If a clocking error occurs in digit matrix multiplier 642, it is possible that one or more modular product accumulations are in error within matrix multiplier 642. However, this clocking error only affects the value of a single RRNS digit modulus and does not affect the value of any other RRNS digit modulus processed by another digit matrix multiplier, such as digit matrix multiplier 640. Because the EDAC circuits 620b, 621b can detect and correct single digit errors, the digital clocking error(s) is isolated and eliminated thereby correcting the entire product matrix result.

Theoretical Basis of EDAC in RRNS

There are numerous methods and studies of RRNS error detection and correction in the prior art. One of the major limitations in this body of work is the lack of efficient detection and correction of arithmetic errors in a signed RRNS representation. There are several reasons for this. For one, some EDAC of the prior art is based on methods that rely on a consistency check, and this definition of consistency check is partially based on concepts of binary EDAC and have not provided a general enough framework to develop a practical, fully signed RRNS EDAC solution. Another reason is likely due to incomplete efforts regarding the formal reasoning of error detection and correction of RRNS arithmetic.

The novel methods and apparatus for EDAC of the present invention are based on a new understanding of the mathematics of RRNS arithmetic processing and includes a new solution to implementation of EDAC apparatus which can seamlessly process positive and negative values represented in an RRNS. Moreover, the methods of the present invention preserve the notion that all redundant digits of an RRNS are operated upon in the same manner, and that any valid combination of RRNS digits that complete a valid range can be used to recover any data value, be it a positive value or negative value. However, in order to disclose these new methods, it is necessary to briefly review prior art understanding of redundancy and EDAC in an RRNS.

Consider the use of an RNS word Y representing a positive integer value x consisting of four digits, $$x \equiv Y = \{d_1, d_2, d_3, d_4\} \qquad (1)$$

having corresponding pair-wise prime digit moduli, $$(m_1, m_2, m_3, m_4) \qquad (2)$$

then the RNS number system range M of the RNS word Y is given by, $$M = m_1 * m_2 * m_3 * m_4 \qquad (3)$$

and the total range of positive integers x that are conventionally encoded in Y is, $$0 \leq x < M \qquad (4)$$

Where the range M of (n) number of non-redundant digits of Y limit the integer values that may be represented and in general is given by, $$M = \prod_{i=1}^{n} m_i \qquad (5)$$

The RNS of (1) can be expanded by adding more digits. Normally, when more digits are added to the definition of Y, the range M will increase accordingly, and a larger value x may be represented according to (3); however, if we choose (by design) to limit our numeric range of x while we increase the range M by one or more digits, we define an RRNS system. For example, consider a new RRNS word Y' which is created by adding two additional digits to Y thereby increasing the word-size to six digits, $$Y' = \{Y, d_5, d_6\} = \{d_1, d_2, d_3, d_4, d_5, d_6\} \qquad (6)$$

and consider that range M is increased to M' by adding two pair-wise prime moduli $m_5$ and $m_6$, each associated with digits $d_5$ and $d_6$ respectively, $$M' = M * m_5 * m_6 = m_1 * m_2 * m_3 * m_4 * m_5 * m_6 \qquad (7)$$

To further develop notation, a range function is defined to denote a range M without reference to each modulus $m_i$ of a word Y, $$M = \text{range}(Y) \qquad (8)$$

In Y', the digits $d_5$ and $d_6$ are so called redundant digits in the prior art. This means that the values for $d_5$ and $d_6$ must be set so that, $$Y' = Y = x \qquad (9)$$

The redundant digits $d_5$, $d_6$ have additional requirements when working with error detection and correction systems. In particular, it is necessary to define redundant digits with a moduli having a larger range than any moduli (2) of the original RNS system Y (1). Therefore, the magnitude of each digit modulus is chosen such that, $$m_1 < m_2 < m_3 < m_4 < m_5 < m_6 \tag{10}$$

This is an important condition since for our example we require any product of any four distinct moduli $m_i$ to be greater than or equal to M, so that, $$\Pi m_i \geq M, \text{ any four distinct } i \tag{11}$$

To develop these notions further, it is desirable to adopt notation to indicate when a digit is invalid, or "undefined"; the notation below specifies that digit position of $d_5$ and $d_6$ are undefined which is shown as an asterisk with the specified digit subscript. Thus, the RRNS word with undefined digits (Y'*) could be formed by the concatenation of the RNS word Y and two undefined digits as shown in Eq. 9 and equivalently in short notation as, $$Y'^* = \{Y, *_5, *_6\} = \{d_1, d_2, d_3, d_4, *_5, *_6\} \tag{12}$$

The function which sets the digit values $d_5$ and $d_6$ to the correct value to satisfy Equation (9) above is called a base extend (BE) function, which accepts as its input all "valid" digits of an RNS word having one or more invalid digits, and produces as output a larger RRNS word where all digits are valid. The base extend function BE( ) acts on the word size Y', and sets the value of undefined digits $d_5$ and $d_6$ so that (9) is satisfied. Various notation is developed to convey the base extend operation, $$Y' = BE(Y'^*) = BE(\{Y, *_5, *_6\}) = \{Y, d_5, d_6\} = \{d_1, d_2, d_3, d_4, d_5, d_6\} \tag{13}$$

Notice the equivalency in the expressions provided by the notation above. A more concise notation essentially performing the same function is, $$Y' = BE_{M'}(Y) \text{ range}(Y) \leq M' \tag{14}$$

In Equation (14) above, the notation for the BE( ) function specifies the RRNS word Y' be assigned the value of the RNS word Y; furthermore, the BE( ) notation specifies the target number range of Y' by use of the suffix M'. The specification of the target range is useful; it describes all moduli that must be base extended if they are undefined, such as digits $d_5$ and $d_6$ in our example. This notation is particularly useful for error correction since any smaller set of RNS digits can be extended into any larger size RRNS word size. The notation preserves the concept that different RNS digit sets represent different RNS number systems having different numeric ranges M.

In order to discuss error detection and correction of RRNS data in more detail, it is necessary to establish variable symbols for common RRNS metrics and relate them to established restrictions. In this disclosure, the total number of residue digits of an RRNS word Y' is p digits, and the total number of non-redundant digits is n and the total number of redundant digits is r, so that, $$Y' = \{d_1, d_2, \ldots, d_n, d_{(n+1)}, \ldots, d(n+r)\} \tag{15}$$

$$m_1 < \ldots < m_n < m_{(n+1)} < \ldots < m_{(n+r)} \tag{16}$$

$$p = n + r \tag{17}$$

where,
p=total number of residue digits of the RRNS machine word Y'
n=number of non-redundant digits in Y'
r=number of redundant digits in Y'
If we restrict error detection and correction to RNS integer values, then all redundant digits are (assumed) present to serve the function of error detection and/or correction. In this case, it is well established in the prior art that every detectable digit error of an RRNS word requires a single independent redundant digit be present in Y'. Therefore, we introduce a variable d for the maximum number of detectable errors, so that, $$d = r \tag{18}$$

Where,
d=maximum number of detectable digit errors in Y'
Moreover, in this disclosure the total number of correctable digits is denoted by s. It is well established in the prior art that two redundant digits are required for every digit in error that can be corrected in an RRNS representation. Therefore, $$r = 2*s \tag{19}$$

So, when correcting s digits of an RRNS word Y', we have a total number of RRNS digits p equal to, $$p = n + 2s \tag{20}$$

where,
s=total number of correctable digits in Y'
Exemplary RRNS Integer System
It is helpful to show RRNS concepts of error detection and correction using an example RRNS. The example integer RRNS is expressed using notation introduced earlier. Starting first with a non-redundant RNS integer value Y expressed in minimal digit form as, $$Y = \{d_1, d_2, d_3, d_4\} \tag{21}$$

with associated digit modulus, $$m_1 = 125, m_2 = 128, m_3 = 131, m_4 = 137, m_5 = 139, m_6 = 149 \tag{22}$$

and an RRNS Y' word derived from Y (22) by adding two redundant digits $d_5$, $d_6$, $$Y' = \{d_1, d_2, d_3, d_4, d_5, d_6\} \tag{23}$$

with associated digit modulus, $$m_1 = 125, m_2 = 128, m_3 = 131, m_4 = 137, m_5 = 139, m_6 = 149 \tag{24}$$

the following variables are defined for our example integer RRNS system, $$p = 6, n = 4, r = 2, s = 1 \tag{25}$$

For the example at hand, the total range of the valid integers M is, $$M = 125*128*131*137 = 287152000 \tag{26}$$

Therefore, our example integer RRNS system supports unsigned values as large as 287152000-1 (<M). And for the example at hand, the total range of the extended RRNS word Y' is, $$M' = 125*128*131*137*139*149 = 5947205072000 \tag{27}$$

Assuming the range of the valid data representation is <M, Y' can allow us to detect as many as two digits in error with 100% confidence and allows us to recover at most one digit in error. As an example of a typical value encoded in the example RRNS, the decimal value 123456789 is encoded as, $$Y' = \{39, 21, 31, 61, 47, 8\} = 123456789_{10}$$

where according to well defined definition for RNS digits $d_i$ of an RRNS word Y', $$d_i = |Y'|_{m_i} \tag{28}$$

Various Ways of Detecting RRNS Digits in Error

To recover an RRNS digit in error, there are several approaches that have been suggested or used in the prior art. Some of the earliest methods for error detection and correction of residue arithmetic was published in the 1960's by Svoboda and Valach, and Watson and Hastings.

In a prior art method proposed by Watson, error detection is based upon the use of redundant digits to act as a consistency check. Furthermore, Watson suggests the use of specially selected modulus that meet certain properties so that a LUT can be used to store both an indication of which digit is in error and provide a correction constant to correct the digit in error. Briefly described, the LUT is indexed by the difference of the two redundant moduli to determine which digit is in error. If the LUT indicates an error, a correction value is returned by the LUT to provide a value to correct the digit in error.

There are many issues with the approach of Watson for a practical design. For one, the scheme relies on specially selected moduli which limits the range and usefulness of RNS arithmetic. The approach also works on positive integers in a straightforward manner but is much more complicated when considering signed values, i.e., values that may be positive or negative.

Another method of detecting and correcting residue digits is attributed to Jenkins and Barsi. In Jenkins and Barsi's approaches, comparison of trial digits sets is used to determine if an unsigned integer is in error or not, however, the subject and methods of error detection of negative numbers using this scheme is not complete.

In a recent scheme developed by Deng and Srikanth, RRNS error detection of negative and positive RRNS numbers is based on a so called "Excess-M/2" number representation which forces the range of the negative values to be located to allow conventional error detection principles of the prior art; moreover, the work leverages off the work of Watson, such that specialized moduli are required. More significantly, this scheme requires that the results of arithmetic be modified so that a redundant range according to prior art understanding of numeric redundancy in RRNS is maintained; because of this approach, the arithmetic algorithms and results for most basic arithmetic operations of the ALU must be modified. Altering the arithmetic results by adding extra ALU operations slows the ALU, and furthermore, the resulting excess-M/2 representation complicates the design of a practical, flexible ALU by altering the natural arithmetic result of most every basic arithmetic operation. This makes the use of the Excess-M/2 representation impractical for high-speed matrix multipliers, such as the matrix multiplier illustrated in FIGS. 6a, 6b.

Figure 7A:
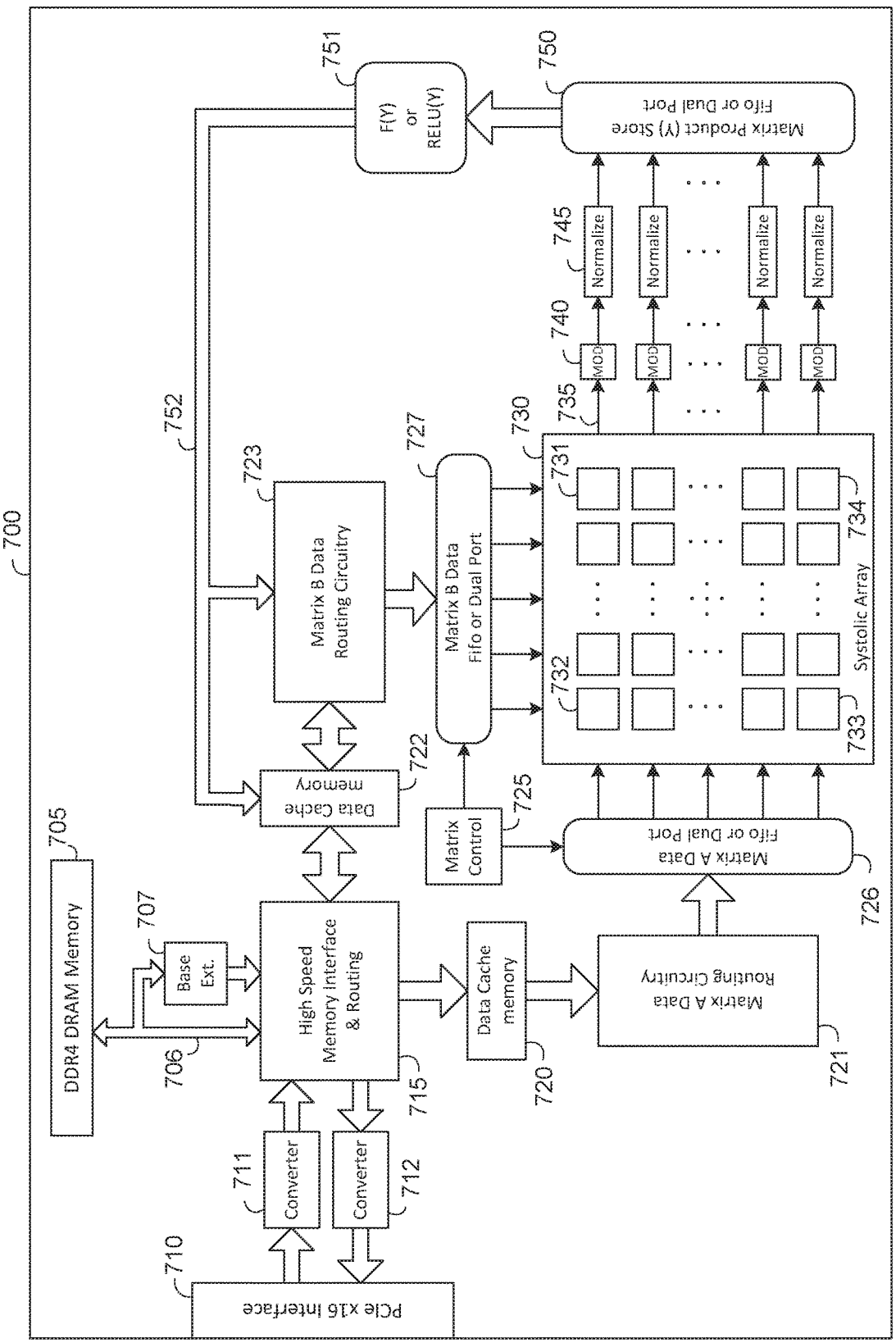
FIG. 7a is a block diagram of an exemplary TPU accelerator card supporting continuous pipelined flow of error corrected dot products.

For reference sake, FIGS. 7a, 7c and 7c are included to describe an RNS based hardware matrix multiplier. FIG. 7a provides an overview of a PCIe based accelerator card that employs an RRNS based tensor processor unit (TPU) to perform neural network applications in a high reliability environment, such as space-based applications.

Figure 7B:
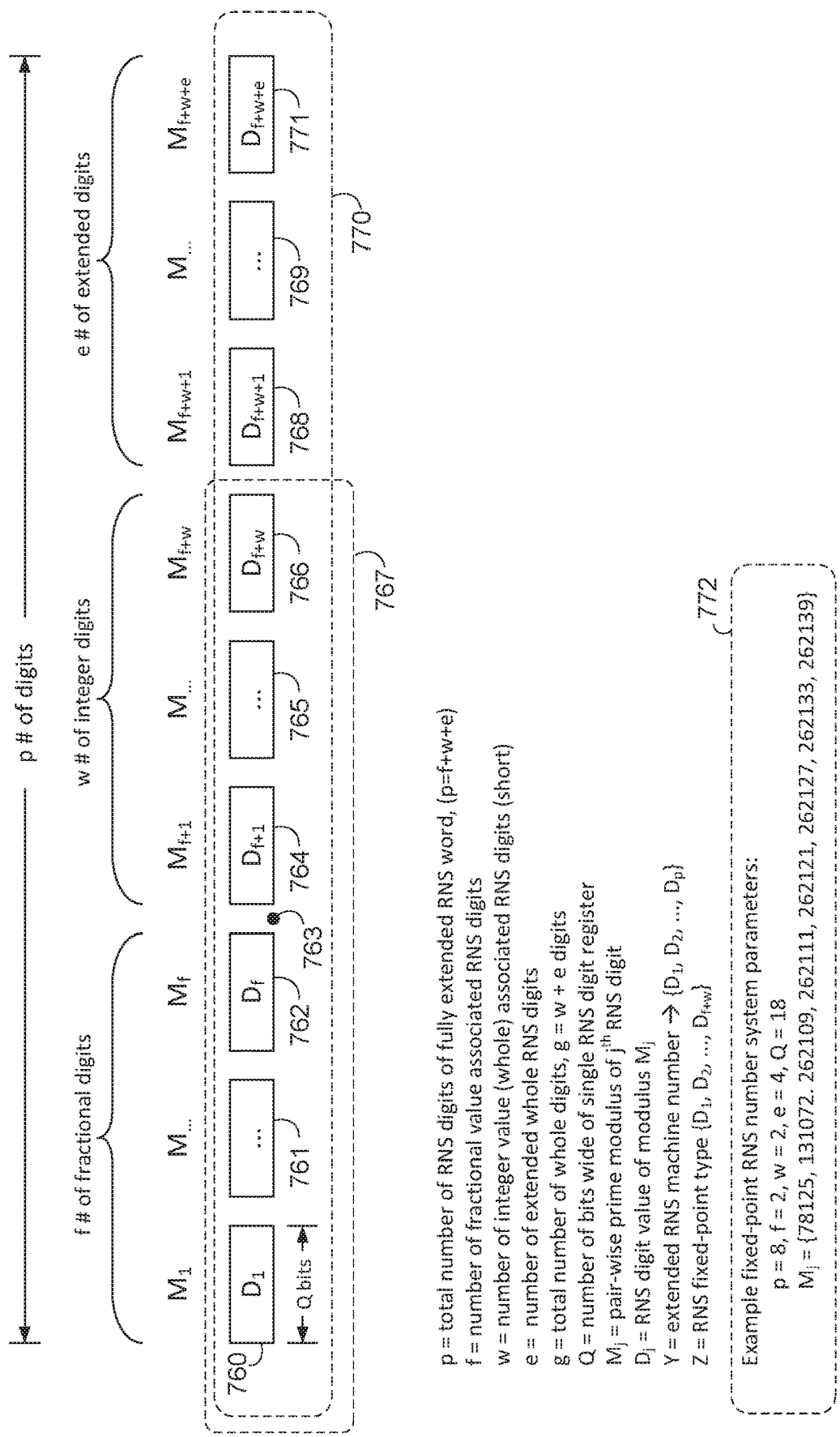
FIG. 7b is a block diagram of a signed RNS fixed-point machine word format.

FIG. 7b and FIG. 7c provide an overview of the fixed-point RNS number format used in a conventional RNS TPU not utilizing error correction. In a later section, the RNS fixed-point format of FIG. 7b, 7c is transformed to an RRNS fixed-point format by addition of two or more redundant digits so that operation of the TPU is maintained, and simultaneously, a continuous error detection and correction of arithmetic can be performed within the TPU accelerator of FIG. 7a. For more information on RNS fixed-point arithmetic, refer to U.S. Pat. No. 9,081,608.

RRNS EDAC Using Comparison

Mixed radix conversion can be used to detect if an RRNS residue digit is in error by using the ability of mixed-radix format to compare numbers directly. There are several variations in the prior art noted above.

Intuitively, if we assume that at most one digit is in error in Y' of the example above, then the value of Y may be recovered by ignoring or skipping the digit in error. Therefore, if we know what digit is in error, we can simply ignore that digit, since it is known the five remaining digits have enough range to represent Y. In fact, if there are two digits in error, and we know which two digits are in error, we can still recover Y from Y' since the four valid digits have enough range to represent Y. In these cases, all we have done is ignore redundant digits and reduce the range of our number system under test, and this did not change the value of Y' according to Equation (9).

The problem in most applications is we do not know which RRNS digit is in error. To determine which digit is in error, it is observed that a single incorrect RRNS digit in Y' will always transform a value that lies in a legal range to a value that lies in an illegal range. The reason is due to the uniqueness of RNS values. For example, for any value represented by any combination of the first n non-redundant digits, there is one and only one digit value that is defined for any redundant digit such that the RNS value Y remains unchanged in Equation (9) and the value remains less than the value M as in Equation (4). This is due to Equation (28). Therefore, any other value for the redundant digit must bring the value of Y' into the illegal range, i.e. greater than M.

Thus, a comparison can be used to act as a consistency check on Y' for a single digit in error, and a plurality of comparisons is needed to determine which combination of digits is valid if more than one digit is in error.

By means of example, if one digit is in error, a single comparison may establish this fact since Y'>M. On the other hand, if two digits is in error in the example RRNS, this can be determined by taking all possible sets of five (5) digits and determining if the number represented by each digit set is valid or not. If all sets of five (5) digits are invalid, then at least two digits are in error. If only one set is valid, then one digit is in error, and if all sets are valid there is no error.

Similarly, when performing error correction, it is necessary to establish a valid set of five (5) digits for which a base extend function can be applied to correct the digit that is skipped. Therefore, when using comparison for implementing error correction, and/or detection of more than one digit in error, there is a need to generate basic combinations of RRNS digit sets for purpose of range comparison.

In the methods of the present invention, an error detection and correction (EDAC) unit is designed so that errors are not only detected but corrected, so the combinations of RRNS digits are required for comparison testing; each digit combination being a unique set of five (5) digits from a total of six (6) digits of Y' by means of the present example. In general, for an RRNS word of p digits total and s number of digits to recover, the total number of trial digit sets (t) will not exceed p choose (p−s) digits $$t = \binom{p}{p-s} = \binom{6}{5} = 6 \quad (29)$$

or 6 total sets in our example system above where,
t=the (maximum) number of trial digit sets.

To assemble digit sets for double digit error correction, if we assume two digits in error, then the total number of RRNS digits required will be p=8 in our example, and total digits to skip for each trial set is s=2, so the total number of trial digit sets is 8 digits choose 6, or 28 trial sets, $$t = \binom{8}{8-2} = 28 \quad (30)$$

Consider the case for single digit correction of RRNS arithmetic which has the property of having the least number of trial digit sets to test. In Table 1, the example six-digit RRNS indicates the $d_4$ digit is in error using the symbol 'e' and illustrates each trial digit set as having a different skipped digit position denoted by an asterisk. When an MRC procedure is used to convert each trial digit set to mixed radix format, it is only the value of the digits of Trial Set 4 that is less than the range M, and so the digit in error is known to be digit $d_4$, and furthermore, the value of Y is also known.

TABLE 1

| $M_1 = 125$ | $M_2 = 128$ | $M_3 = 131$ | $M_4 = 137$ | $M_5 = 139$ | $M_6 = 149$ | Value | Description |
|---|---|---|---|---|---|---|---|
| $d_1$ | $d_2$ | $d_3$ | $d_4$ | $d_5$ | $d_6$ | Y' < M | Positive RRNS Y' |
| $d_1$ | $d_2$ | $d_3$ | e | $d_5$ | $d_6$ | $Y_e \geq M$ | RRNS Y' with error |
| * | $d_2$ | $d_3$ | e | $d_5$ | $d_6$ | $Y_1 \geq M$ | $Y_1$ = Trial set 1 |
| $d_1$ | * | $d_3$ | e | $d_5$ | $d_6$ | $Y_2 \geq M$ | $Y_2$ = Trial set 2 |
| $d_1$ | $d_2$ | * | e | $d_5$ | $d_6$ | $Y_3 \geq M$ | $Y_3$ = Trial set 3 |
| $d_1$ | $d_2$ | $d_3$ | * | $d_5$ | $d_6$ | $Y_4 < M$ | $Y_4$ = Trial set 4 |
| $d_1$ | $d_2$ | $d_3$ | e | * | $d_6$ | $Y_5 \geq M$ | $Y_5$ = Trial set 5 |
| $d_1$ | $d_2$ | $d_3$ | e | $d_5$ | * | $Y_6 \geq M$ | $Y_6$ = Trial set 6 |

If we base extend the RRNS digits of trial set 4, the $d_4$ digit is recovered to its original state since there is only one value for the digit $d_4$ such that Y'<M which preserves the digit as redundant.

Base extension hardware may also support a comparison function as shown in the prior art. The mixed-radix digits corresponding to the range value M may also be stored to make comparison more efficient, thus the comparison is performed entirely in mixed-radix format and typically least significant digit first in high-speed applications.

Error Correction of Positive Numbers

In the new methods presented in this disclosure, we refer to each trial set of digits under test as a derived RNS number system. Moreover, each digit set $Y_i$ represents a reduced number system, having been reduced by a single digit modulus. Therefore, the terminology favored in this disclosure is to refer to each digit set $Y_i$ as being reduced by a single modulus. This point might seem subtle, but its description maintains the underlying mathematics of each transformation of Y' to $Y_i$.

When a value represented by a derived number system $Y_i$ is converted to mixed-radix format, such a number is referred to as a "projection" in the prior art. This value can be shown to be greater than or equal to M if a digit in Y' is still in error. The range $M_i$ of each projection $Y_i$ can be described by, $$M_i = \frac{1}{m_i} \prod_{j=1}^{p} m_j \quad (31)$$

Each projection $Y_i$ is formed using distinct 'trial' digit sets. For the case of correcting a single digit in error, the value of each projection $Y_i$ can be stated mathematically as, $$Y_i = |Y'|_{M_i} \quad (32)$$

A weighted representation for each projection is obtained by converting each $Y_i$ to mixed radix format, $A_i$, given in functional notation as, $$A_i = MRC(Y_i) \quad (33)$$

and given in the mixed-radix digit set nomenclature herein as, $$A_i = <a_1, a_2, \ldots, a_{(p-1)}> \quad (34)$$

Where mixed-radix digits are written least significant digit first, i.e., in a reverse significance notation.

According to the prior art, and assuming only one digit in error, an error is detected in digit $d_i$ when one and only one digit set $Y_i$ is less than the range M. In practice this check can be implemented using a direct comparison of $A_i$ versus M for all i, and in some preferred embodiments, is performed in mixed-radix format. Using a mixed-radix equivalent value, if only one $A_i$ is less than M, the $Y_i$ digit set is deemed to have no error but the "skipped" digit is known to be in error. Base extending the digit set $Y_i$ to restore the digit $d_i$ corrects the $d_i$ digit.

The operation of the error correction unit can be described in conditional form as, $$Y_R = \begin{cases} Y' & \text{if } A_i < M, \text{ for all } i \\ BE_{M'}(Y_i), & \text{if } A_i < M, \text{ for one } i \\ Y_e, & \text{error, other cases} \end{cases} \quad (35)$$

An error status may also be generated by the error detection and correction unit. In the case of an EDAC unit designed to correct single digit errors in p total digits, the status can be defined as, $$\text{status} = \begin{cases} \text{no error,} & \text{if } A_i < M, \text{ for all } i \\ \text{corrected error,} & \text{if } A_i < M, \text{ for only one } i \quad 1 \leq i < p \\ \text{uncorrected error,} & A_i > M, \text{ for all } i, \text{ or else} \end{cases} \quad (36)$$

In practice, the value of M is stored as a constant in mixed-radix format and comparison proceeds least significant digit first. However, because each comparison involves a value $A_i$ of a unique number system with unique range $M_i$, a different set of mixed-radix digits is required to represent the constant M in each case; for this system to work, the digit order of mixed-radix conversion is pre-determined or fixed.

Example of Positive Value Error Detection and Correction

FIG. 8 illustrates a table containing an example EDAC processing using an unsigned RRNS representation and using the method of comparison to determine the validity of each digit group $Y_i$. In this example, the digit moduli $m_1$ column 800 through $m_6$ column 810 are shown above each digit $d_1$ through $d_6$ respectively. The magnitude of each RRNS value is shown in decimal format in column 815 and a description column 820 is provided for most important parameters for the EDAC trial testing of unsigned integers. This example RRNS system and the values were processed using RNS-APAL which is an RNS arbitrary precision software library which allows easy printing of RNS values in numerous number formats.

In the row 825 of the table of FIG. 8, the magnitude M=287152000 is provided for reference. In row 830, an example data value equal to 123456789 is shown without errors in any RRNS digit. In the next row 835, the $d_4$ digit of column 805 is modified so that it is in error by changing its value from 61 to an incorrect value of 23. This results in a very large value for Y' which is far beyond the legal range of M as noted in the magnitude column 815 row 835.

Values for each trial set $Y_i$ is indicated in rows 840 through 865. For example, trial set $Y_1$ is the RRNS digit set created by ignoring the first digit, $d_1$, and processing only digits $d_2$ through $d_6$ by means of comparison against the legal range M of row 825. As shown in row 855 of the table of FIG. 8, the digit $d_4$ is skipped, and the value returned by the remaining digits $Y_4$ is shown to be correct; the value is the same value as the original value of row 830 and furthermore, and more significantly, this value is the only value less than M of row 825. Comparison provides a consistency check since in the case of a single digit error, the digit in error can be detected and isolated.

In the example at hand, if error correction is required, the digits of trial set $Y_4$ are base extended so that the $d_4$ digit is returned; i.e., the skipped digit in position $d_4$ is set back to the value 61 by a base extend operation.

Method of Error Detection and Correction of Negative Numbers

The detection and correction of errors in residue numbers having a signed representation is more problematic. According to a recent study, three methods are known, yet only two methods have a solution in the prior art. The third un-solved method is only proposed because it represents an ideal solution. This disclosure will show several methods for performing the ideal solution to implementing error detection and correction of RRNS values having a signed representation. In a later section, this disclosure will introduce the extension of these EDAC methods to signed, fractional representations.

Negative Value RRNS Representation

Negative numbers are often represented in RNS using a number system of M states by dividing the M states into two numeric ranges, one for positive integers and the other for negative integers. For even RNS systems (M is even), one method is to divide the two ranges to support the method of complements. In this case, we define a sign(x) function, $$\text{sign}(x) = \begin{cases} +: & \text{if } x < M/2 \\ -: & \text{if } x > M/2 \quad 0 \leq x < M \\ ovf: & \text{if } x = M/2 \end{cases} \quad (37)$$

For method of complements, we also define a complement function as, $$\bar{x} = |M-x|_M, 0 \leq x < M \quad (38)$$

Figure 9A:
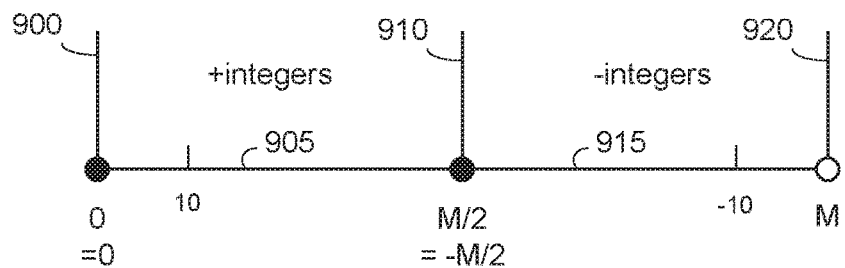
FIG. 9a is a number line illustrating a complement-M signed RNS representation.

FIG. 9a shows a number line of M states illustrating the signed number ranges using the method of complements. As shown, the number zero 900 starts the number line and positive integers are represented in a naturally increasing manner. Negative numbers start at the end of the number line 920 at state M-1 (since the value M is excluded from the set of valid states) and decrease in value as the negative value decreases. The mirror symmetry of the number line of FIG. 9a provides a means to perform a sign complement function and supports signed arithmetic directly.

The primary issue with a complement representation of the prior art is when the RNS word Y is extended to an RRNS word Y' for the purpose of error detection. Because the range of the overall machine word Y' is now M', the complement equation (38) is modified to, $$\bar{x} = |M'-x|_{M'}, 0 \leq x < M \quad (39)$$

Figure 9B:
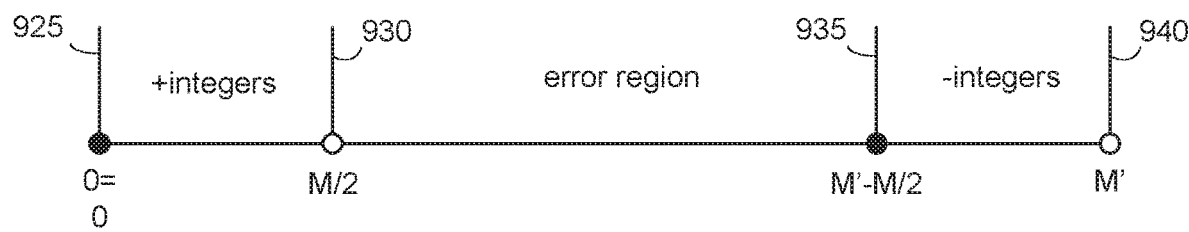
FIG. 9b is a number line illustrating a complement-M' signed RRNS representation.

FIG. 9b shows the consequence of increasing the number line range from M to M' while limiting the valid number range to a value M as required to maintain an RRNS representation. For example, the number zero 925 and the positive numbers less than (M/2) 930 lie in the number line within the range value M, but the negative integers lie in a number line range far in excess of the value M. This is a problem for error detection of the prior art, since for the case of negative numbers the EDAC will indicate an error. The number line of FIG. 9b illustrates the problem. Using method of complement arithmetic in RRNS, the region of negative integers between (M'-M/2) 935 and (M') 940 is relocated to the 'end' of the number line such that all negative integers Y'>M.

It might seem a simple solution to maintain redundant digits in such a manner as to preserve the method of complements with range M. Such a scheme is called "complement-M signed RRNS representation" and is illustrated using 9c.

Figure 9C:
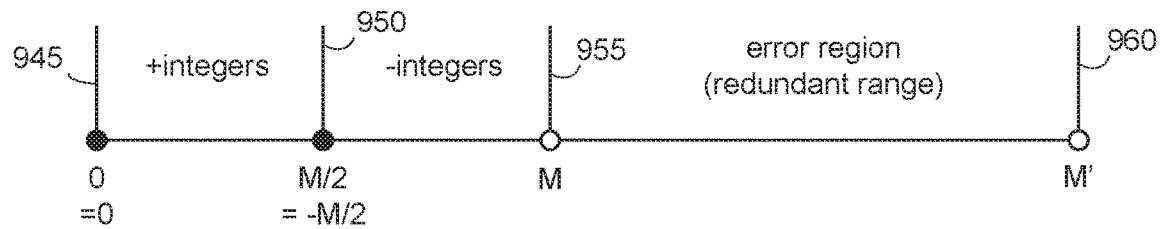
FIG. 9c is a number line illustrating a complement-M signed RRNS representation.

The problem with complement-M signed RRNS representation is that redundant digits do not follow the same arithmetic functions as non-redundant digits of range M. For example, decrementing the number zero by decrementing all digits of the RRNS word Y' will land its magnitude (state) to a value of M'-1. Clearly, this is out of the range M indicated in FIG. 9c. Thus, one of the main requirements using Complement-M signed RRNS representation is to re-generate redundant digits after each arithmetic operation. However, the complement-M signed RRNS representation fails to provide a straight-forward way to directly check and correct arithmetic operations since the operations on redundant digits must differ from that of the non-redundant digits. Schemes to solve this seemingly simple problem are complex.

Figure 9D:
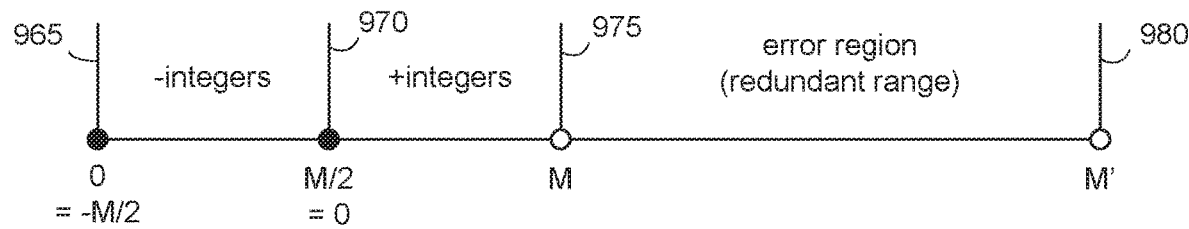
FIG. 9d is a number line illustrating an excess-M/2 signed RRNS representation.

A recent solution proposes the use of an RRNS number system referred to as "Excess-M/2 signed representation". A number line representation of the Excess-M/2 representation is shown in FIG. 9d. In this number line, the negative integers and the positive integers are switched, such that the zero is at M/2 970 and negative integers lie decreasing to the left in FIG. 9d and positive integers are increasing to the right up to the value M 975 as shown. The goal of this scheme is to attempt to keep RRNS arithmetic results within the legal ranges indicated and less than M.

However, there are many similar issues with Excess-M/2 signed representation as with complement-M signed RRNS representation of FIG. 9a. For example, Excess-M/2 signed representation requires that arithmetic itself undergo correction in order to maintain arithmetic correctness within the modified number line, and to ensure redundant digits undergo a similar arithmetic operation. Unfortunately, there are many problems with this approach, including the need to know the sign of arguments for every ALU operation, and the fact that many operations are slowed by the introduction of correction steps for each arithmetic operation. Look-up tables have been used in the prior art, but this approach fails to compete in aggressive high-performance designs, such as high-speed product accumulators required within the RNS-TPU.

Prior to this disclosure, there is no known solution to the use of "standard method of complements" representation as shown in FIG. 9b for error detection and correction of RRNS arithmetic. What is needed is a solution that maintains redundancy while preserving the same operations for each digit, and more importantly, allows us to choose any digits of the arithmetic result to use. This allows true arithmetic detection and correction of arithmetic.

As shown in FIG. 9b, the prior art viewpoint is that since negative numbers are located at the end of the number line representation, recovery of a value greater than the magnitude (M−1) is not possible. However, it should be noted that standard complement arithmetic including negative numbers is still limited to a range of M provided our arithmetic results do not over-flow. This can be seen by considering only the non-redundant digits of Y'. In other words, if we simply truncate the redundant digits of Y', it is seen that method of complements arithmetic is working as expected in the range M, and all legal values and arithmetic results lie in the number line of FIG. 9a, and that all valid representations are less than M.

Furthermore, consider a non-zero positive value x is represented in a complement-M' RRNS representation of FIG. 9b, then we have from Equation (39) a single subtraction for calculating the complement of x, $$x = M' - x \quad 0 < x < \frac{M}{2} \quad (40)$$

Clearly, the RRNS representation of a positive value x lies within the positive integer range of FIG. 9b. In this case, the redundant "range" is preserved, and it is possible to detect and correct digits in error for values that lie in the valid positive numeric range, i.e. such that Y'<M/2.

But we also observe other facts. The complement of a valid positive value lies in the negative integer range as indicated in FIG. 9b, and for every non-zero positive Y' value, a complement exists. Further consider the complement function is reversible, so that negative integers are converted back to positive integers by substituting for x its complement, $$x = \bar{\bar{x}} = M' - (M' - x) \quad 0 < x < \frac{M}{2} \quad (41)$$

Or treating the integer x as a signed quantity according to the rules of Equation (37) then, $$-x = M' - x \quad 0 < |x| < \frac{M}{2} \quad (42)$$

Recall the case when x is positive, the redundant range is at the end of the number line of FIG. 9b, so the prior art notion of error recovery works as normal. However, for the negative value, error recovery is not deemed possible since the magnitude of the signed representation is larger than M. However, because of the reversibility of (41) it can be deduced that applying a complement to a negative value corrects this problem, and furthermore restores the redundant range to the end of the number line of FIG. 9b, thereby allowing error detection and correction by comparison of the value against the value M/2 for negative numbers.

Using the notion of complements leads us to revise the range for which numbers are valid during the error detection stage. In the prior art, much attention is paid to the value of M, that is, Y' should be less than M, or Y'<M. However, for the method of complements, recall the sign of a value less than M is provided by the sign(x) function of (37), but this can only be analyzed directly using the first n digits, or non-redundant digits. By applying the MOD M function to Y', the arithmetic of the non-redundant digits is captured, and the total range of the underlying complement arithmetic in RRNS is seen to be M, but for signed values this is only valid if we apply a range check using a constant of M/2 as in the sign(x) equation of (37). The application of the MOD M function to the arithmetic of Y' in RRNS makes it possible to see the underlying arithmetic number line within Y' is continuous as in FIG. 9a.

In the final analysis it doesn't matter that a value Y is <M for error detection and correction. Instead, it only matters that there is one and only one unique mapping of M number of states of Y' that constitute valid arithmetic, and that for any of the other M*($m_5$*$m_6$−1) number of states as in the example, the resulting value of Y' can be detected to lie outside the unique (legal) mapping of M states. Since the unique mapping of M arithmetic states adheres to the method of complements and follows a linear arithmetic progression of positive and negative integers, any value Y' is validated using comparison versus the legal integer ranges M/2 and ~M/2.

In one method of the present invention, it follows that both the value Y' and its complement (~Y') undergo trial testing using a comparison function against the value M/2 as discussed. This doubles the number of trial comparisons that must be performed but allows an unparalleled level of error detection and correction of arithmetic.

Formally, we can write the novel error detection and correction strategy which uses a complement operation to recover the redundant range when a value is negative in the form of a conditional equation, $$Y_R = \begin{cases} BE_{M'}(Y_i'), & \text{if } A_i < M/2, \text{ for one } i \\ \overline{BE_{M'}(\overline{Y_i'})}, & \text{if } \overline{A_i} < M/2, \text{ for one } i \\ Y', & \text{all } A_i < \frac{M}{2} \text{ or all } \overline{A_i} < \frac{M}{2} \end{cases} \quad (43)$$

Figure 10:
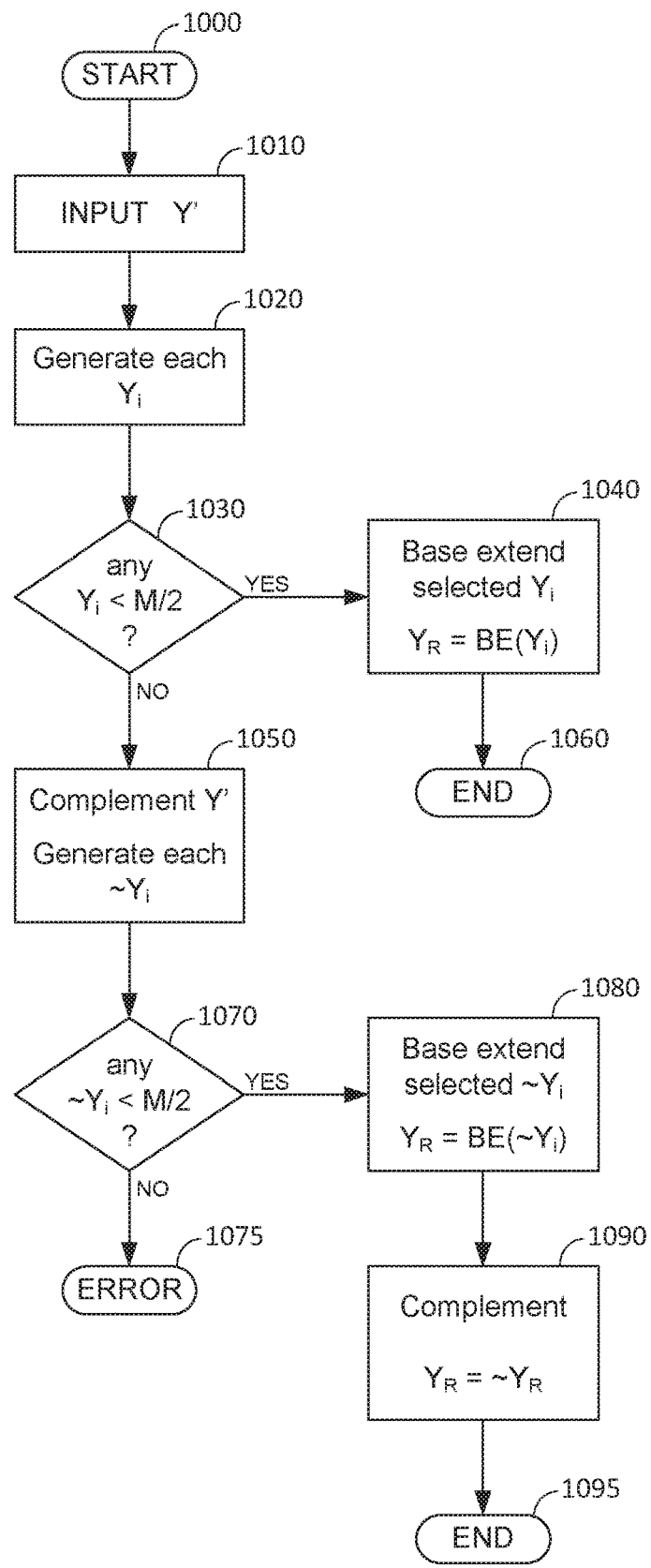
FIG. 10 is a flow chart of an exemplary method of error detection and correction of a complement-M' signed RRNS representation.

These revelations motivate a new form of error detection and correction in RRNS using method of complements representation as indicated by the number line of FIG. 9b and the conditional Equation (43). A basic flow chart for the recovery of signed RNS integers using the RRNS complement strategy is shown in FIG. 10. In this flow chart, data values Y' enter at start 1000 for processing and a corrected result $Y_R$ is generated at END 1060, 1095, or an error 1075 is generated indicating the data representation is in error.

A couple of points are worth explaining in the flow diagram of FIG. 10. The flow chart does not show all details and is provided for means of basic disclosure. FIG. 10 assumes any number of recoverable digits since it relies on the trial digit generation block 1020 to account for all required (t) cases. The flow chart of FIG. 10 assumes a recovery will take place. In the novel methods presented herein, this is acceptable for pipelined designs where valid and invalid arithmetic results are corrected in a continuous flow. In this case, a data value Y' that passes every trial test is known to be valid but correcting any of the trial digit sets $Y_i$ will return the original value Y'; thus, the correction operation may be redundant in the case of continuous correction of a high-speed arithmetic pipeline, such as pipeline 620 of FIG. 6. In other words, correcting a value Y' that is not in error returns the value Y', and this may be convenient in some embodiments.

In FIG. 10, flow chart step 1020 includes the process of generating each RRNS digit trial set $Y_i$. A series of comparisons 1030 provides a branch to step 1040 if any $Y_i$ is less than M/2 according to (43). In one embodiment, the decision block 1030 will pass the first digit combination $Y_i$ less than M/2 for base extension in step 1040, and if the input value Y' has no errors, this will be the first trial set $Y_1$ by means of example. Otherwise, other embodiments will require decision block 1030 check and ensure that one and only one trial digit set $Y_i$ is valid, or that all trial sets are valid before transferring control to step 1040.

In FIG. 10, if no trial digit sets $Y_i$ are less than M/2, control moves to the flow chart step 1050 to generate trial RRNS digits sets $\sim Y_i$ derived from the complement of ~Y'. This step can be processed earlier in some embodiments. Flow continues to step 1070 to test if any $\sim Y_i$ is less than M/2. If so, the value of the chosen $\sim Y_i$ is base extended in flow chart step 1080. Next, in flowchart step 1090, the corrected positive value $Y_R$ is re-converted to a negative value by a complement operation in step 1090, since the values $\sim_i$ derived from the complement of Y' are known to be originally negative. If no trial digit set $\sim Y_i$ are less than M/2, then an un-corrected error is detected in step 1075.

It is obvious to those who study the disclosure that many variations are possible from the basic flowchart of FIG. 10, such as more precise error checking that discerns more error cases. Another preferred variation allows both the positive range and the negative range comparisons to be performed at the same time, however, this requires twice the circuitry. This scheme is shown in the block diagram of FIG. 11.

Figure 11:
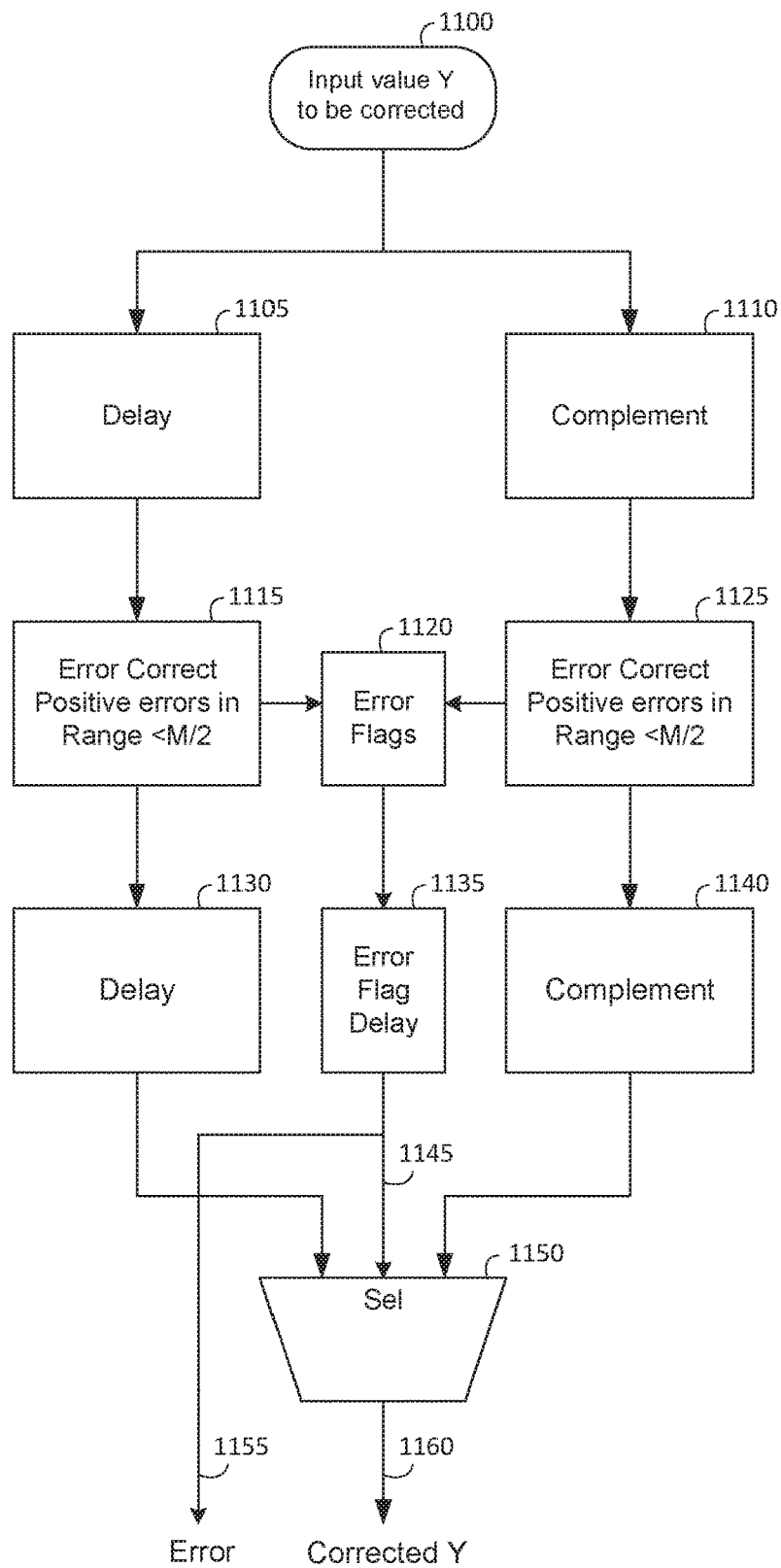
FIG. 11 is a block diagram of an exemplary error detection and correction pipeline unit for signed complement-M' RRNS values.

FIG. 11 illustrates a block diagram of one preferred embodiment of an EDAC unit for error detection and correction of arithmetic results and values represented in a complement-M' RRNS representation as illustrated in the number line of FIG. 9b. In FIG. 11, two data flows are provided in parallel indicated by the data flow from block 1105 to bock 1150, and by the data flow from block 1110 to block 1150. Both data flows may be in parallel and may be synchronized.

The data flow from the input value port 1100 is diverted to block 1105 where it might be delayed remaining in synchronization with the same input data undergoing a complement operation in block 1110. In block 1115, a trial digit set $Y_i$ are tested to be less than M<2, and if so, a positive error flag is set in an error pipeline unit 1120. In block 1125, trial digit set complements are tested to be less than M/2, and if so, a negative error flag is set in error pipeline unit 1120. Both blocks 1115 and 1125 detect errors and correct digits in error. If a negative value is in error, the value is corrected as it exits block 1140 but must be complemented so that it is returned to a negative value;

Depending on the synchronized state of the error flag delay line 1135, the state of the corresponding error code, associated with a positive and negative value in synchronization and produced by block 1130, 1140, controls which one of the two values is to be selected by selector 1150 and transmitted as a corrected result 1160. An error code status signal 1155 is generated to ascertain the status of each arithmetic result or signed value passed through the dual pipeline EDAC of FIG. 11.

One issue with the new EDAC method is the need to generate two groups of trial digit sets since both positive values $Y_i$ and the negative values $\sim Y_i$ must be compared against the value of M/2.

This results in more latency and more hardware for the EDAC unit.

A new improved method of the present invention which eliminates the need to form or generate a second group of trial values $\sim Y_i$ is disclosed next. This new method treats the redundant range of the RRNS number system in an entirely new and novel manner. It is noted during base extension of a negative representation for x that the resulting RRNS increases the number system range from M to M', such that, $$BE_{M'}(x) = BE_{M'}(|M - x|_M) = M - x \quad 0 < x < \frac{M}{2}, M' > M \quad (44)$$

Equation (44) tells us that the base extend function increases the number system range to M' but does not affect the magnitude of ~x as in required by Equation (9). Therefore, the BE function does not preserve the negative value representation for x in the new RRNS of range M'. In fact, it is possible the representation is now an illegal value within the RRNS number line representation of FIG. 9b. A correction constant C for negative numbers is defined to correct this faulty condition, so we have, $$|M' - x|_{M'} = C + (M - x) \quad 0 < x < \frac{M}{2} \quad (45)$$

The quantity on the left side of Equation (45) is the correct representation for negative x in an RRNS of range M', and the value on the right is the base extended value of a negative x in a number system of range M plus a correction constant C. The correction constant is therefore, $$C = |M' - M|_{M'} = M' - M \quad 0 < x < \frac{M}{2} \quad (46)$$

In our derivation, the correction constant C is added to the base-extended complement ~x to restore it to the legal range of negative values in the RRNS range M' as provided by representation of FIG. 9b. In this case combining Equations (44) and (45), $$|M' - x|_{M'} = BE_{M'}(x) + C \quad 0 < x < \frac{M}{2} \quad (47)$$

In an alternate interpretation of Equation (47), it is noted the correction constant C is a negative representation for M in the extended RRNS system in Equation (46) so a subtraction of M modulo M' can be used for correction for convenience (since the value of M is needed to derive the negative range constant later). The subtraction causes an under-flow but results in a valid representation for the negative value x in the extended RRNS system. This is described by combining (46) and (47), $$|M' - x|_{M'} = |BE_{M'}(x) - M|_{M'} \quad 0 < x < \frac{M}{2} \quad (48)$$

Moving backwards, a valid negative representation ~Y' for a positive, non-zero value x in an RRNS representation of range M' may undergo digit truncation so that (i) number of derived RRNS digit sets ~$Y_i$ are generated. Thus, substituting (40) into (32) we have, $$Y_i = |M' - x|_{M_i} = |M_i - x|_{M_i} = M_i - x \quad 0 < x < \frac{M}{2}, \quad (49)$$
$$M' > M_i > M$$

Surprisingly, the truncation of a valid negative representation Y'=−x by a redundant digit produces a valid negative value for x in the new representation $Y_i$. To visualize this case, the number line of FIG. 9b is revised to reflect the ranges of the new derived number system $Y_i$, namely replacing M' with $M_i$ in FIG. 9e.

Understanding that a valid representation for negative values is preserved by truncation of a redundant digit provides a means to perform error detection and correction directly on $Y_i$ regardless of the sign of $Y_i$ and without requiring a second set of trial values ~$Y_i$ as required by the method of FIG. 10 and FIG. 11. In other words, if it is assumed only one digit in Y' is in error, then it is possible to directly detect if a trial digit set $Y_i$ is in a legal negative range, and if so, to correct the digit by base extension, and then use a correction constant C as in Equation (47) to restore the base extended trial set $Y_i$ back to the original Y' without error.

However, regardless of the reduced number system, the positive value range check ($R_i$) for each trial digit set $Y_i$ is always M/2, so we have, $$R_i = \frac{M}{2} \quad (50)$$

On the other hand, the upper negative range value (~$R_i$) is different for each number system with range $M_i$. Taking the complement of M/2 for each different number system of range $M_i$ using (49) provides a specific upper range value ~$R_i$ used for each trial digit set $Y_i$ and is given by, $$\tilde{R}_i = M_i - \frac{M}{2} \quad (51)$$

In a similar manner, replacing $M_i$ for M in equation (46) a correction constant $C_i$ is defined for each trial set $Y_i$, $$C_i = M' - M_i \quad (52)$$

We are now able to define the new method for detecting and correcting errors directly in an RRNS complement-M' arithmetic providing for un-precedented error correction of arithmetic capability. First, a generalized equation describing the recovery of a base extended trial digit set $Y_i$ representing a negative value x is provided by substituting $Y_i$ for x, and $C_i$ for C in (47), $$|M' - Y_i|_{M'} = BE_{M'}(Y_i) + C_i \quad (53)$$

The recovery of positive values is the same as discussed for unsigned values except the valid range is reduced from M to M/2. Therefore, the basic operation of an EDAC unit capable of processing both positive and negative representations in RRNS can be described in conditional form as, $$Y_R = \begin{cases} BE_{M'}(Y_i): & \text{if } A_i < M/2 \\ BE_{M'}(Y_i) + C_i: & \text{if } A_i > \tilde{R}_i \\ \text{invalid}: & \text{else} \end{cases} \quad (54)$$

Consider if Y' is in error by a single digit, then only one trial digit set $Y_i$ is valid; therefore, either its mixed-radix equivalent $A_i$ is less than M/2, or $A_i$ is greater than ~$R_i$. All other trial sets will lie in an invalid number range of the number line of FIG. 9e. If there are no errors in Y', then all trial digit sets $Y_i$ will be less than M/2, or all $Y_i$ will be greater than ~Ri. Any other combination of comparison results indicates an inconsistency typically blamed on errors within the EDAC itself. Therefore, the conditional Equation (54) may be read sequentially; i.e., the first valid case of (54) is acted upon. Otherwise, the conditional (54) does not adequately describe all nominal error cases.

In practice it is acceptable to base extend the first trial digit set $Y_i$ that lies in a valid range. If the valid range is the negative value range, then the base extended value $Y_i$ is corrected by adding the correction constant $C_i$. If there are any inconsistencies, then either the assumption that one digit in error is incorrect, or there is an error in the EDAC unit itself, and so $Y_R$ is returned invalid, or at least without confidence. For example, if there is a trial digit set $Y_i$<M/2 and another trial set $Y_i$>~$R_i$, there is an un-recoverable error and the correction result $Y_R$ is not known to be valid. Other variations of the error correction unit using the concepts and methods developed herein are possible, such as an EDAC state machine that handles all error cases in a specific and predictable manner.

It is noted that if a trial digit set $Y_i$ is determined to be equal to M/2 or equal to ~M/2, the trial digit set is in error, and the error is not correctable. In this case, the trial digit set $Y_i$ is not correctable due to the fact it requires at least two RRNS digits to be in error to transition any legal value <M/2 to a value equal to M/2.

Figure 12:
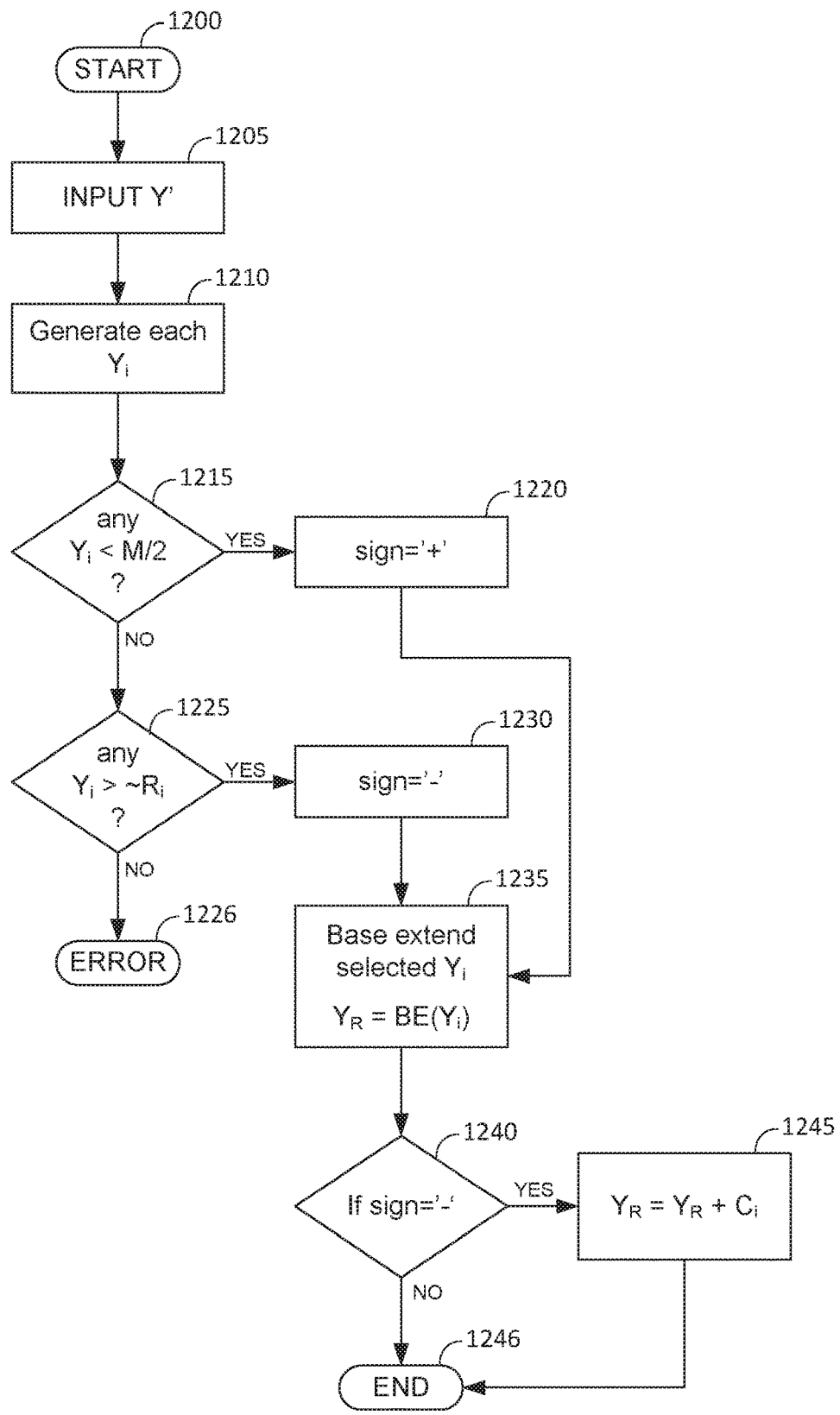
FIG. 12 is a flow chart of an exemplary method of error detection and correction of a complement-M' signed RRNS representation which comprises less resources.

A basic flow chart is provided in FIG. 12 to outline the new and novel method of error detection and correction of arithmetic according to the conditional Equation (54).

In FIG. 12, an RRNS data value Y' is input at step 1205 and at step 1210 one or more trial digit sets $Y_i$ are generated from Y'. Next, in decision step 1215 a single $Y_i$ less than M/2 triggers a transition to step 1220 which flags a positive operand is being corrected. Otherwise, if no single $Y_i$ is less than M/2, control transitions to decision step 1225 which tests if a single $Y_i$ is greater than its corresponding negative range value ~$R_i$ as provided by Equation (51). If so, control transitions to step 1230 to flag the trial digit set $Y_i$ (and by association the input operand Y') as negative. In both steps 1220 and 1230 control transitions to a common base extend step 1235. During base extend step 1235, the undefined "skipped" digit $d_i$ of the digit set $Y_i$ is returned to a redundant value as defined in Equation (14) regardless if the value of $Y_i$ is positive or negative; this operation produces a corrected result $Y_R$ 1235. Next at step 1240 if the sign of the corrected digit set $Y_i$ is negative, control transitions to step 1245 where a correction constant $C_i$ is summed to the result $Y_R$ to compensate for the range difference between the trial digit set $Y_i$ and the final word size Y', and in order to maintain the negative number representation in a legal negative range.

Like the flowchart of FIG. 10, in FIG. 12 trial sets $Y_i$ are generated in step 1210 and each trial set is compared to M/2 in step 1215. After this, the basic flow chart of FIG. 12 differs in several important ways from the flow chart of FIG. 10. Most important there is only a single set of trial digits $Y_i$ required for flow chart of FIG. 12 as opposed to two sets required for flow chart of FIG. 10, i.e., sets of $Y_i$ and sets of $\sim Y_i$. This fact allows the flow chart of FIG. 12 to perform the required two range comparisons needed but only on a single argument $Y_i$.

Moreover, the flow chart of FIG. 12 allows for a single base extension step 1235 regardless of the sign of the value $Y_i$. The dual comparison steps 1215, 1225 can be performed at the same time in practice which allows the sign of the operand to be known so that a correction by $C_i$ is performed as a last step if the value is negative. Therefore, the flow chart method of FIG. 12 requires less circuitry and/or less latency than the flow chart of FIG. 10.

Exemplary Negative Value Error Detection and Correction

FIG. 13a illustrates an example of error detection and correction of negative RRNS values using the methods of the present invention. In FIG. 13a, a signed RRNS representation uses the method of complements as depicted in the number line of FIG. 9b. The method of the present invention uses a comparison to determine the validity of any value represented in Y' via analysis of each distinct trial digit group In this example, the RRNS digit moduli $m_1$ column 1300 through $m_6$ column 1305 are shown above each RRNS digit $d_1$ through $d_6$ respectively. The magnitude of each RRNS value is shown in column 1310 and a description column 1315 is provided for most important parameters for the EDAC trial testing of signed integers. Furthermore, column 1320 provides an (upper or) negative range value $\sim R_i$ for each trial set $Y_i$ and column 1325 provides a correction constant $C_i$ 1325 associated to each trial set $Y_i$ of row 1335 through row 1340. In the example RRNS system of FIG. 13a, the decimal equivalents for each trial value $Y_i$ and each constant $\sim R_i$ and $C_i$ were generated using RNS-APAL and listed in the table of FIG. 13a to ease comparison and analysis.

In the example of FIG. 13a, the positive range value M/2 is shown in row 1315 of the table of FIG. 13a. The total RRNS range M' is shown in the table row 1331. The data value under test Y' is set to a negative value equal to −123456789 decimal and is shown in table row 1333. An error is introduced into the digit $d_4$ in the table row 1334 by substituting the incorrect value 23 for the correct value 76. Trial digit sets $Y_i$ are shown in table row 1335 through last table row 1340 and the magnitude of each trial digit set $Y_i$ is shown in the table column 1310. When analyzing the data set of FIG. 13a, it is seen that when digit $d_4$ is skipped in row 1338, $Y_i$ has a magnitude of 43286799211. In only trial set 4 is the magnitude of $Y_4$ greater than its associated upper range constant $\sim R_4$ which is equal to 43266680000.

Because the value of a single $Y_i$ is greater than its associated negative range constant $\sim R_i$, the value of Y' is negative and a correction constant $C_i$ is applied to the final result as in (53). Therefore, when the value of RRNS magnitude $Y_4$ and $C_4$ of the table of FIG. 13a is summed, the value equals the magnitude for the original data value Y' of row 1333. As shown in the flow chart of FIG. 12, the base extend function 1235 is used to restore the error digit $d_4$ in the example but does not change the magnitude of the trial digit set $Y_4$; the base extend operation is applied before the correction constant $C_4$ is added in step 1245.

The decimal values for the example of FIG. 13a are relisted in the tabulated table of FIG. 13b using mixed-radix number format instead of decimal format. Mixed-radix number are denoted using the angle brackets < > as in Equation (34). This is instructive in order to see the actual data values processed by the EDAC using the methods of the present invention.

In FIG. 13b, some mixed-radix numbers are listed with an asterisk which indicates the mixed-radix number or constant was derived with respect to the underlying RRNS number system, such as $Y_i$, which also has a skipped digit modulus. Because each trial digit set $Y_i$ skips one (or more) RRNS digit (moduli), their mixed-radix equivalents are shown with one or more asterisks representing one or more skipped radix. Thus, the same constant value encoded in one mixed-radix number system will reflect different digit values then the same value is encoded in a mixed-radix number system of a different radix set. However, in the table of FIG. 13b, the range constants themselves are different, as they reflect values derived from the distinct range of each number system of $Y_i$, i.e., $M_i$=range($Y_i$) is unique for each i.

Apparatus of the Present Invention

In earlier sections of the present disclosure, a formal method is disclosed for performing error detection and correction of a value in a standard complement representation of full redundant range (M') but the value limited to a range of −M/2 and +M/2, i.e. a complement-M' RRNS representation. This section will disclose high-performance pipelined EDAC circuit designs and apparatus and will disclose one or more preferred embodiments of the present invention and by means of example only.

Figure 14A:
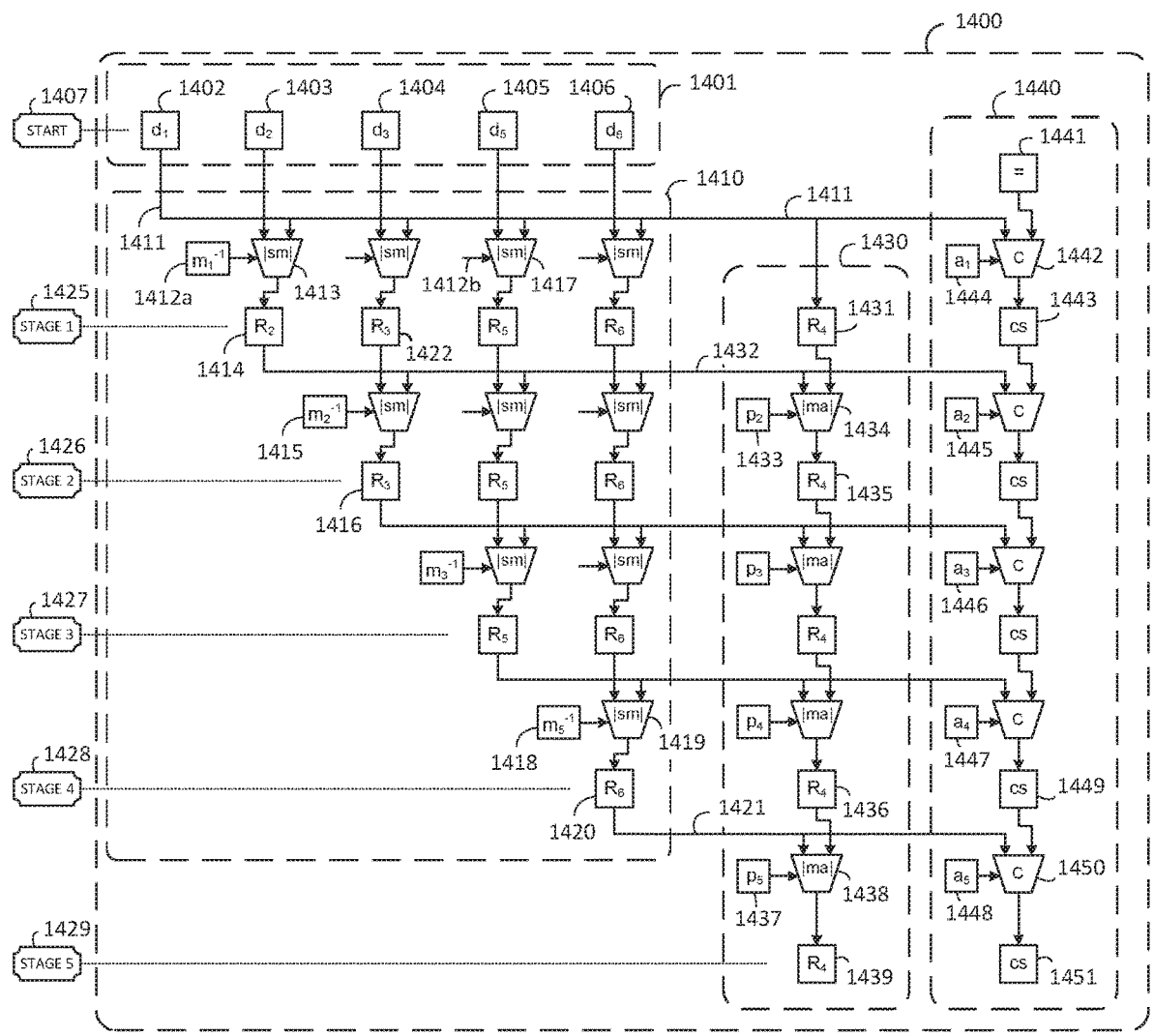
FIG. 14a is a block diagram of an exemplary error detection and correction circuit for a single RRNS digit of a positive data value represented in an RRNS.

FIG. 14a illustrates a pipelined EDAC circuit 1400 which performs error correction and detection of a single five-digit trial digit set $Y_i$ by means of example. The circuit 1400 as drawn in FIG. 14a only processes a digit combination $Y_i$ that is known to be positive, i.e., less than M/2, and is disclosed first to simplify the explanation of the preferred circuits that follow. The diagram is labeled using pipeline stage markers, such as pipeline STAGE-1 marker 1425, to illustrate basic transitions of data processed by the pipeline of FIG. 14a and to allow a cross reference between the circuit diagrams and data tables of each example presented herein.

Continuing with the present example, the circuit of FIG. 14a illustrates the processing of trial digit set $Y_4$ since the RRNS digit $d_4$ is skipped during processing by mixed-radix conversion circuit 1410. The trial digit set $Y_4$ is tested at input word 1401 and consists of RRNS digits $d_1$ 1402, $d_2$ 1403, $d_3$ 1404, $d_5$ 1405 and $d_6$ 1406 but does not include the RRNS digit $d_4$ as it is excluded in trial set $Y_4$. Thus, in a hardwired pipelined design, trial digit sets $Y_i$ may be formed by directly connecting the non-skipped digits to the input 1401 for each converter of FIG. 14a.

In FIG. 14a, the input data word $Y_4$ is converted to mixed-radix format using mixed-radix circuit 1410. In tandem to the mixed-radix converter 1410 is a pipelined comparator 1440 and a pipelined RRNS digit recombination unit 1430. The RRNS digit recombination unit 1430 is responsible for performing a base extend operation 1040 as in the flow chart of FIG. 10 to recover the skipped digit $d_4$. For an EDAC supporting positive values only, the pipelined comparator 1440 performs a comparison of the input word $Y_4$ against the positive constant M/2.

Each major pipelined apparatus comprising the single digit EDAC of FIG. 14a is discussed next by means of explanation of key elements of basic hardware of the present invention.

Mixed-Radix Converter Unit

The basic architecture of a pipelined mixed-radix converter 1410 is known in the prior art and has been studied by Jenkins and others. As a brief review, the pipelined mixed-radix converter consists of a plurality of modular subtract-then-multiply processing elements designated by its symbol (|sm|), such as |sm| processing elements, 1413, 1417. Each |sm| processing element is associated with a multiplicative constant $m_i^{-1}$, such as constant $m_1^{-1}$ 1412a, which represents the multiplicative inverse of each digit modulus (acting as a divisor) with respect to each other digit modulus.

To relieve clutter in the diagram of FIG. 14a, some constant symbols, such as constant $m_1^{-1}$ 1412 a is absent on other |sm| processing element, such as |sm| element 1417; in this case, the value of the multiplicative inverse input 1412b for this particular |sm| element is implied by the position of the |sm| element 1417 in the mixed-radix converter unit 1410.

Figure 15A:
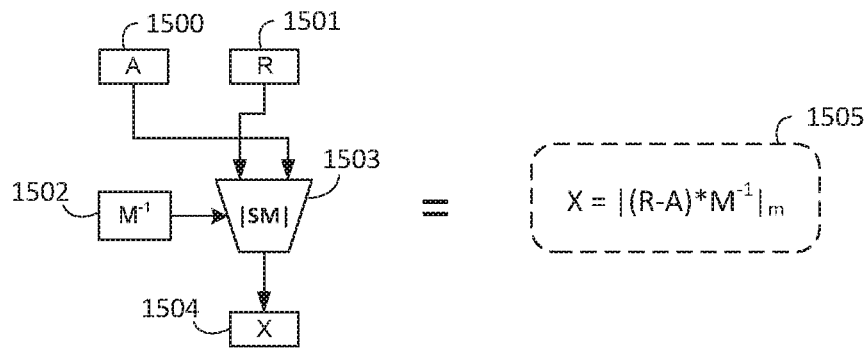
FIG. 15a is a block diagram of an exemplary modular subtract-then-multiply processing element.

The symbol and function of the |sm| element is shown in FIG. 15a. In FIG. 15a the operation of a typical |sm| unit is the value A 1500 is subtracted from the incoming digit value R 1501, and the result of the subtraction is multiplied by the constant $m^{-1}$ 1502 in a modular fashion, that is MOD m, where m is the modulus of the digit moduli being processed. The modular result of the |sm| processing element is stored in the output register X 1504. An equation describing the operation of a typical |sm| element is shown enclosed in dotted lines 1505.

For example, at STAGE-1 1425 of FIG. 14a, the multiplicative inverse $m_2^{-1}$ 1415 of the $R_2$ digit modulus ($m_2$) with respect to the digit modulus $m_3$ is multiplied by the difference of $R_3$ 1422 and $R_2$ 1414, and its result stored in $R_3$ 1416 at STAGE-2 1426. This process is performed successively at each STAGE-1 1425 through STAGE-5 1429 of the mixed-radix converter circuit 1410 producing a mixed-radix digit $R_{i+1}$ at each $i^{th}$ STAGE. Each mixed-radix digit $R_i$, such as mixed-radix digit $R_6$ 1420, is transmitted via a digit bus, such as digit bus 1421, to the comparator pipeline 1440 and the digit recombination (base extend) pipeline 1430.

In one preferred embodiment of the EDAC of the present invention, regarding the operation of the mixed-radix converter 1410 of FIG. 14a, a pre-defined order of mixed-radix conversion is chosen so that each constant used in the EDAC can be pre-computed and stored. In a typical embodiment this digit processing order is chosen such that conversion begins with the least valued modulus $m_1$ and proceeds with each successive valued modulus as defined by Eq. (10).

The order of RNS digit conversion during the process of converting an RNS value to an associated mixed-radix number affects the format of the mixed-radix number system but does not change its range. However, the format of the mixed-radix number system affects the values for mixed-radix constants, and therefore it is advantageous to fix the order of RNS digit conversion for that reason in many preferred embodiments.

Digit Recombination Unit

During processing of pipeline STAGE-1 1425, the first mixed-radix digit ($R_1 = d_1$) is transmitted using digit data bus 1411 to the digit recombination unit 1430. In recombination unit 1430 at STAGE-1 1425, the first stage of recombination value $R_4$ 1431 is simply to store the value of the first trial set digit $d_1$. During processing of pipeline STAGE-2 1426, mixed-radix digit $R_2$ is transmitted using digit bus 1432 to the input of modular multiply-then-add processing unit 1434 where it is multiplied by mixed-radix power constant $p_2$ and this product is summed to value $R_4$ 1431 from STAGE-1 1425 and this modular sum is stored in register $R_4$ 1435.

At each successive stage of digit recombination unit 1430, a mixed-radix digit $R_i$ is received and multiplied by an associated power constant $p_i$; this modular product is then summed with the recombination digit processed from the previous stage of the same modulus. Taken together, all stages of the recombination circuit 1430 perform a "base extend" of the skipped digit $d_i$ by computing a value for a skipped digit $d_i$; mathematically the digit base extend function is defined as, $$d_i = |a_p \Pi_{j=1}^{p-1} m_j + \ldots + a_3 m_2 m_1 + a_2 m_1 + a_1|_{m_i} \quad (55)$$

so that each power factor constant is defined by, $$p_i = \Pi_{j=0}^{i-1} m_j \quad (56)$$

where $m_0 = 1$ by definition, and each radix $m_j$ is associated to each digit of the number system $A_i$ provided by Eq. (34), and where $A_i$ is further related to the modulus of the derived RRNS number system $Y_i$ using the decomposition relation below describing mixed-radix conversion by circuit 1410 which skips conversion by the modulus $m_i$, $$((((((|Y_i|_{M_i} - a_1)/m_1) - a_2)/m_2) - \ldots - a_{p-2})/m_{p-2}) - a_{p-1} = 0 \quad (57)$$

Figure 15B:
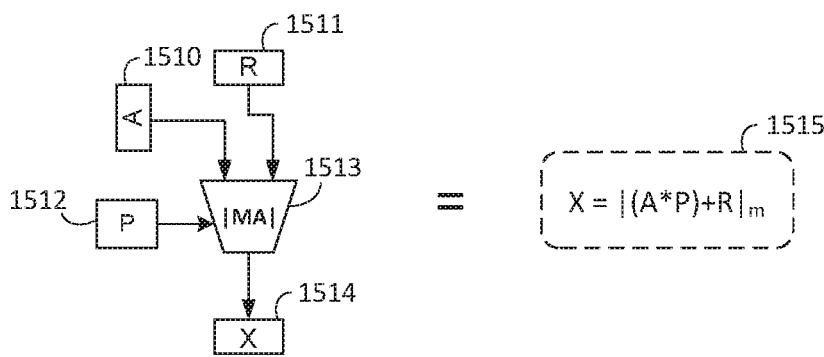
FIG. 15b is a block diagram of an exemplary modular multiply-then-add processing element.

A modular multiply-then-add processing element 1513 is defined in more detail in the block diagrams and equations of FIG. 15b. The modular multiply-then-add (|ma|) element 1513 is denoted using a trapezoid block symbol 1513 with the |ma| label. The function of the |ma| element is shown in dotted lines 1515. The |ma| function receives a mixed-radix digit A 1510 and multiplies this by the constant P 1512 and then sums this product with the prior re-combined state R 1511 modulo m, where m is the modulus of the digit column being processed.

The |ma| symbol may be synthesized from various means, and various methods and circuit topologies. For example, the |ma| symbol may be synthesized using look-up tables, RAM or dedicated circuitry and logic gates. The |ma| symbol in the context of the pipeline digit recombination unit 1430 typically indicates the |ma| element is pipelined itself.

After the processing at STAGE-4 1428 of the digit recombination pipeline 1430, the last |ma|element 1438 performs the last modular multiply-then-add operation using the last mixed-radix digit $R_6$ 1420 generated, power constant $p_5$ 1437 and the prior recombination result $R_4$ 1436, and the modular result of the last |ma|element 1438 is stored in register $R_4$ 1439. The result stored in register $R_4$ 1439 is a base extended value for the RRNS digit $d_4$ derived from the input trial digits $Y_4$ 1401.

Figure 14B:
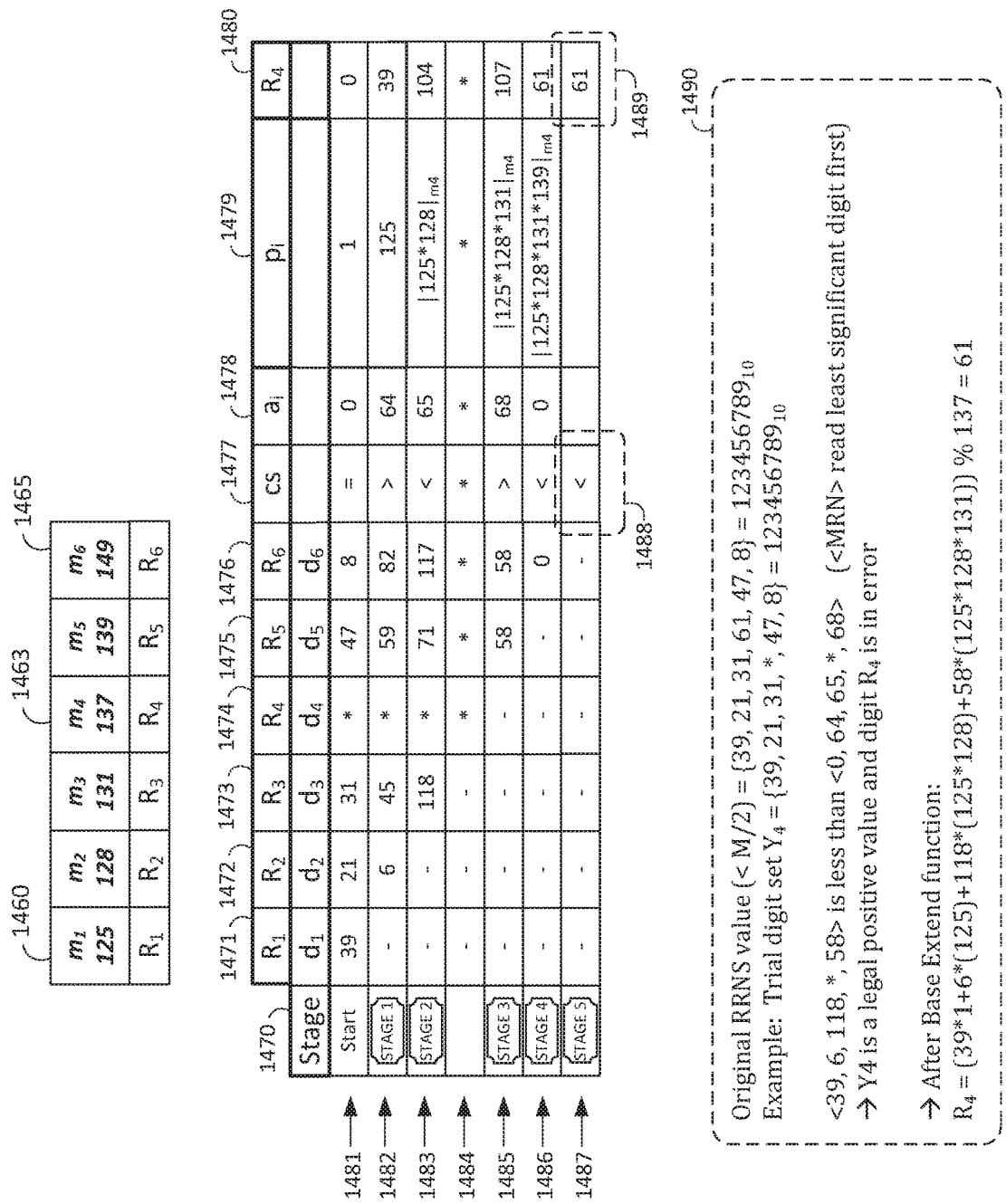
FIG. 14b is a tabulated table illustrating an example error detection and correction calculation for a single digit of a positive RRNS data value.

FIG. 14b provides a data table illustrating an example calculation of a single digit EDAC pipeline 1400. In FIG. 14b, the table lists the transition of a single EDAC calculation through the pipeline as if the input 1401 is held stable for 5 stages of pipeline operation. This provides a means to simplify the explanation of the operation of pipeline 1400 of FIG. 14a and is a technique used throughout this disclosure for means of illustration only.

FIG. 14b shows example values for the recombination digit $R_4$ at each STAGE of FIG. 14a in the table column 1480 and shows the equivalent values for each power factor $p_i$ at each STAGE of FIG. 14a in the table column 1479. In FIG. 14a mixed-radix conversion is processed at each stage of pipeline 1400, the residue digits $R_1$ 1402 through $R_6$ 1420 are shown in a diagonal pattern in table columns $R_1$ 1471 through $R_6$ 1476 of FIG. 14b.

By means of example, the digit $R_4$ 1480 is initialized to zero at start in table row 1481 and in STAGE-1 transitions to value of 39 shown in table row 1482. The product of the previous power $p_i=1$ at table row 1481 and the previous mixed-radix digit, $R_1=39$, equals the value of thirty-nine (39) in table row 1482. In the next stage, the value of the power constant $p_2=125$ multiplied by the value of previous mixed-radix digit $R_2=6$ equals (750) plus the previous value of (39) modulo $m_4(=137)$ 1463 equals the value (104) shown in table row 1483. By STAGE 5 of table row 1487, the value of the recombined digit $R_4=61$ is shown as a final answer. The example calculation of the complete digit re-combination is shown in the calculations enclosed in dotted lines 1490.

Comparator Unit

In FIG. 14a and during processing of pipeline STAGE-1 1425, the first mixed-radix digit ($R_1=d_1$) is transmitted using digit data bus 1411 to the comparator pipeline unit 1440 where it is compared to the first (least significant) digit $a_1$ of a mixed radix constant representing the value M/2 (for positive value EDAC). The mixed-radix constants $a_1$ 1444 through $a_5$ 1448 represent the value of M/2; these digits may be pre-generated and stored as a constant by converting the value M/2 represented in the same RRNS number system as trial digit set $Y_i$ to a mixed radix format; a sample set of mixed radix digits $a_i$ representing the constant M/2 of the present example is provided in column 1478 of the table of FIG. 14b.

Note the asterisk in row 1484 and column 1478 of the table of FIG. 14b indicates that the digit moduli $m_4$ is skipped indicating the digit moduli $m_4$ is not part of the product series expansion for the mixed radix constant $a_i$ ($a_i=<a_1, a_2, \ldots, a_5>$) of column 1478. This is important for purpose of comparison in comparator 1440, since the mixed-radix converter circuit 1410 also skips the digit modulus $m_4$ during mixed-radix conversion.

During each stage of processing of the pipelined comparator 1440, a mixed radix digit is generated by the mixed-radix circuit 1410 and is transmitted to the comparator pipeline 1440 for purpose of performing the comparison step of 1215 of FIG. 12. For high-speed designs, mixed-radix comparison is generally performed least significant digit first, since mixed-radix conversion generates digits having a weighted significance that is generated least significant digit first; however, this is not a limitation of the present design.

Figure 15C:
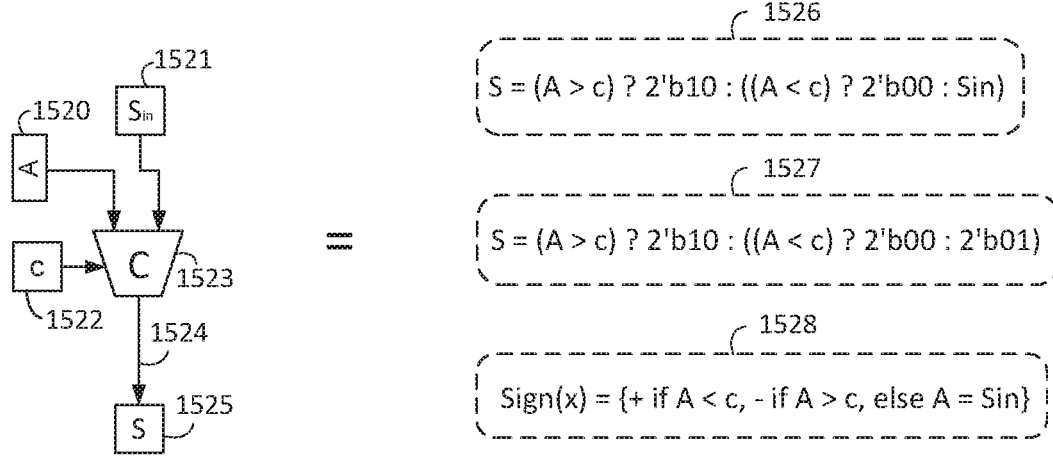
FIG. 15c is a block diagram of an exemplary modular digit comparison unit.

In one preferred embodiment, logic for comparing numbers least significant digit first is required in comparator 1440. For example, if the comparison between a mixed-radix digit generated by converter 1410 and mixed-radix digit of constant M/2 is equal, the prior state $S_{in}$ 1521 of the comparison is passed by comparator element 1523 to the next comparison output stage S 1524 as shown in FIG. 15c. Therefore, during initial processing at STAGE-1, the starting comparator state is set to "equal" 1441 to ensure comparison works in all cases.

The pipelined comparator 1440 includes a plurality of comparator elements, such as comparator element 1442 and element 1450 of FIG. 14a. The operation of a comparator element is described in more detail using comparator element symbol 1523 and typical comparator equations 1526, 1527, 1528 by means of example in FIG. 15c. In one preferred embodiment, comparator element 1523 supports an output bus 1524 consisting of a binary code of one or more bits. The binary code indicates the result of comparison S 1525, and typically indicates comparison states "less than", "greater than", or "equal to".

An example of a mixed-radix comparison performed least significant digit first is indicated in the example comparator status (cs) column 1477 of the table of FIG. 14b. For example, the comparator status cs 1477 is initiated with a state of "equal" at table row 1481 which corresponds to the equal state initializer constant 1441 in the comparator circuit at pipeline START 1407 of FIG. 14a. By pipeline STAGE-1 of row 1481, the digit value $d_1$ is compared to the mixed-radix constant $a_1$ resulting in a greater than symbol in row 1482 of column 1477 since the digit value 39>0. By pipeline STAGE-2 of row 1483, the mixed-radix digit $R_2=6$ is less than the mixed-radix constant $a_2=64$ resulting in a "less than" symbol at row 1483 and column 1477. The pipeline comparison process may toggle the state of comparison cs at each pipeline stage.

For the example illustrated in FIG. 14b, by pipeline STAGE-4 of row 1486, the mixed-radix digit $R_5=58$ of row 1485 is detected less than the mixed-radix constant $a_5=68$ resulting in a "less than" symbol at the next STAGE at row 1486 and column 1477. Referring to FIG. 14a, during processing of pipeline STAGE-5 1429, the last mixed-radix digit $R_6$ is transmitted using digit data bus 1421 to the comparator pipeline unit 1440 where it is compared to the last (most significant) digit $a_5$ of a mixed radix constant $a_i$ representing the value M/2.

By pipeline STAGE-5 1487, the mixed-radix digit $R_6=0$ of row 1485 is detected equal to the mixed-radix constant $a_5=0$ resulting in a "less than" symbol at row 1487 and column 1477 since during an equal condition, the comparator element 1449 of FIG. 14a will pass the prior cs state 1449 indicated by the cs state of row 1486 in FIGS. 14a and 14b respectively. In the example of FIG. 14b, because the final comparison state cs 1451 of FIG. 14a is equal to "less than" as indicated in row 1487, the input word $Y_4$ at START 1481 is detected to be a valid positive value that can be corrected as provided in Eq. (53) using the methods indicated by flowcharts of FIG. 10 and FIG. 12 and using the novel apparatus of FIG. 14a.

Single Signed Digit EDAC

The methods and apparatus of the present invention for error detection and correction of signed values, developed formally and described using equations (37) through (54), are disclosed herein in the form of a preferred embodiment and by means of example. However, many other embodiments are possible, and this is clear to those skilled in the art of error detection and correction circuits.

Figure 16A:
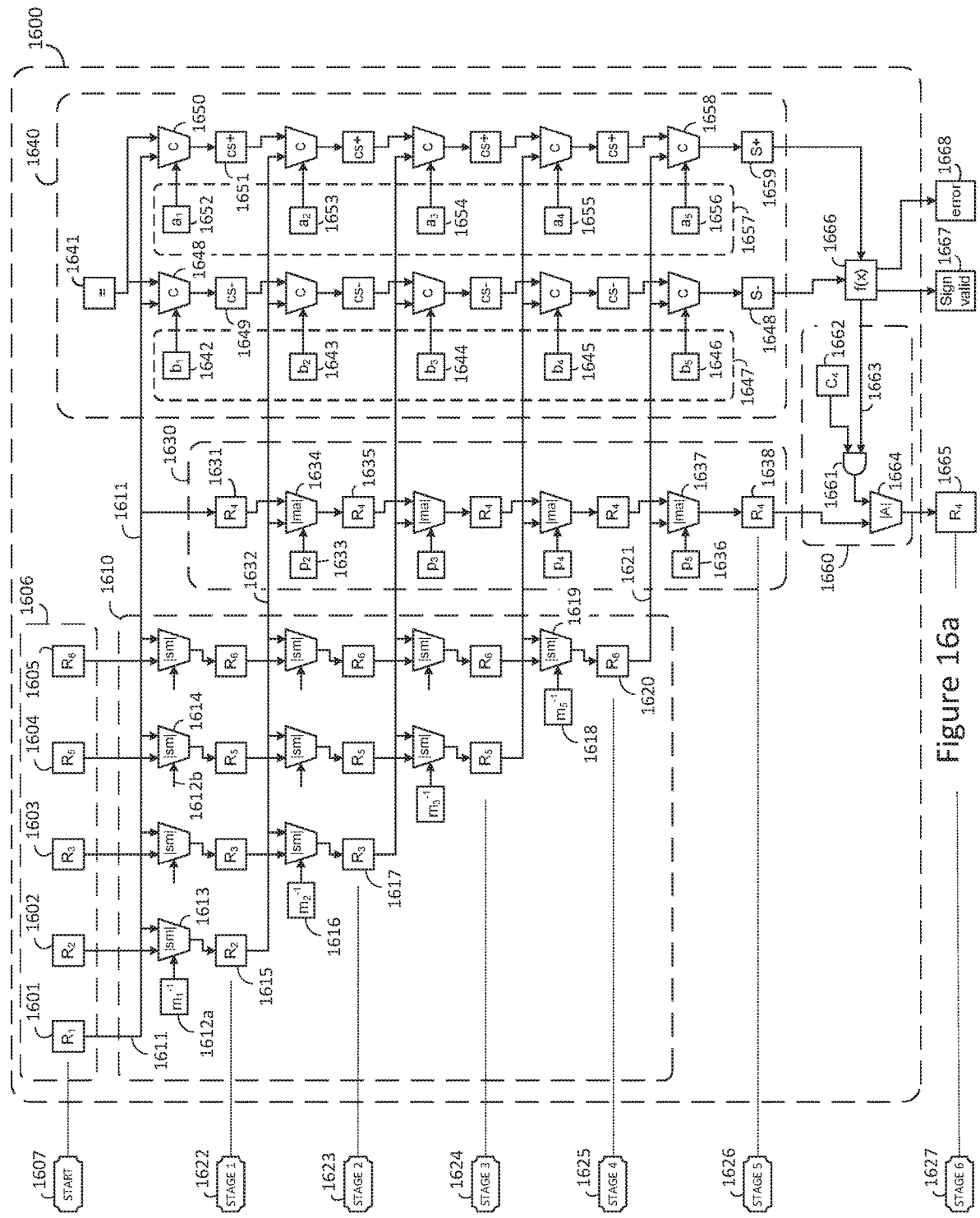
FIG. 16a is a block diagram of an exemplary error detection and correction circuit for a single RRNS digit of a positive or negative RRNS data value.

A novel and unique improvement to the unsigned value, single-digit EDAC pipeline 1400 of FIG. 14a is a "signed" value single-digit EDAC unit 1600 of FIG. 16a. The EDAC 1600 of FIG. 16 is unique as it includes an enhanced comparator unit 1640 and furthermore includes a negative value range correction circuit 1660. The EDAC 1600 also includes a mixed-radix converter circuit 1610 and a digit re-combination unit 1630; these units are substantially the same or like those units discussed for the EDAC 1400 of FIG. 14 and therefore detailed operation of these units will not be re-explained.

The operation of the signed EDAC 1600 of FIG. 16a is that a trial digit set $Y_i$ derived from a signed complement-M' representation Y' is input at pipeline stage START 1607 via input port 1606. At pipeline STAGE-6 1627, and six pipeline stage-cycles later, an error flag result 1668 indicates if the input value $Y_i$ is recoverable, and if so, the RRNS digit value in register 1665 is the corrected digit for the digit in error, which is designated as $R_4$ 1665 by means of example in the circuit diagram of FIG. 16*a*. In other words, the EDAC circuit 1600 of FIG. 16*a* is shown for the correction of the $R_4=d_4$ digit by means of example; other EDACs that correct other RRNS digits $d_i$ can be readily constructed and designed by those skilled in the art of RNS modular circuit design and by referring to the details of FIG. 16*a* for example reference.

The enhanced comparator pipeline 1640 of the EDAC 1600 of FIG. 16*a* includes a comparator pipeline for detection of both the positive case and the negative case of conditional Equation (54). A negative range constant associated to the number range of $Y_i$, as provided by Equation (51), is stored as a series of mixed-radix constants $b_1$ 1642 through $b_5$ 1646 and represents the value of the complement of M/2(~M/2). A positive range constant associated to the number range of $Y_i$, as provided by Equation (50), is stored as a series of mixed-radix digit values $a_1$ 1652 through as 1656 representing the value of M/2. The mixed-radix digits are generated by encoding a range value in the RRNS number system of range $Y_i$ and converting the RRNS value into an associated mixed-radix number of the same range $Y_i$. This is a formal way of saying the mixed-radix digits are formed from a distinct mixed-radix number system with a distinct skipped radix.

At STAGE-5 1626 of the enhanced comparators 1640, and for each value processed by the EDAC 1600, a final determination is stored in negative result error code S- 1648 and positive result error code S+ 1659. When the negative result flag error code S- indicates a legal negative value, (and the positive error flag S+ 1659 simultaneously indicates an invalid positive value), the correction circuit 1660 is activated and the value of the recombination digit, $R_4$ 1638 in the case of the example of FIG. 16*a*, is modified by adding a correction constant $C_4$ using modular adder 1664 as required in the conditional of Equation (54) and for the derivation of each $C_i$ provided in Equation (52).

When the positive result error flag S+ 1659 indicates a valid positive value, (and in some embodiments the negative error result flag S- is tested for an invalid negative value for the same operand $Y_i$) the modular adder 1664 adds the value of zero to the recombination digit value $R_4$ 1638 before storing the base extended result in register $R_4$ 1665. In some embodiments, an error function look-up table or logic f(x) circuit 1666 implements the decision to apply a negative correction constant using correction circuit 1660 or not and implements error signals indicating whether the result was valid 1668 or not, and if valid, the sign valid flag 1667 indicates the sign of the correctable operand $Y_i$ in some embodiments.

An example error detection and calculation processing cycle for the single digit, signed EDAC unit 1600 is illustrated using the data table of FIG. 16*b*. A condensed explanation of the error correction cycle is illustrated in the dotted lines 1697 of FIG. 16*b*. The table of FIG. 16*b* is expanded by adding a column for the negative range (~R=~M/2) mixed-radix digits $b_i$ 1680 and the negative comparison status column 1679 and the correction constant $C_4$ 1683 applied at STAGE 5 row 1690. The test input value $Y_4$ is the negative of the test value for the positive example above, and is equal to $-123456789_{10}$, and is represented using RRNS digits of row 1684, and is represented using a complement-M' RRNS representation of FIG. 9*b*.

As mixed-radix conversion proceeds, the $d_4$ digit recombination proceeds as indicated in column $R_4$ 1682, and table rows 1685 through row 1691 of FIG. 16*b*. The example shows the results of the dual comparison 1692, 1693, in row 1690 corresponding to S+ 1659 and S- 1648 of the comparator unit 1640 of FIG. 16*a*. By means of example, the positive compare status 1692 reflects that the value $Y_i$ exceeds the positive range constant $a_i$=M/2, so that the value $Y_i$ is not a legal positive value; moreover, the negative compare status 1693 reflects that the value $Y_i$ exceeds the negative range constant $b_i$=~M/2, and this indicates that the value $Y_i$ lies in the legal negative value range as depicted by the number line of FIG. 9*e*.

Because the trial value $Y_i$ of row 1684 is determined to be a legal negative value in the example of FIG. 16*b*, a correction constant $C_4$ 1683 is added to the recombination result $R_4$ 1694 and the summation returned as a result $R_4$ 1695. As shown in FIG. 16*b*, the final base extended result for the digit $d_4=R_4$ is 5+71=76, which is the original value for digit $d_4$ encoded with the decimal value $-123456789_{10}$ as shown enclosed in dotted lines 1697.

Signed Word EDAC Unit

Figure 17:
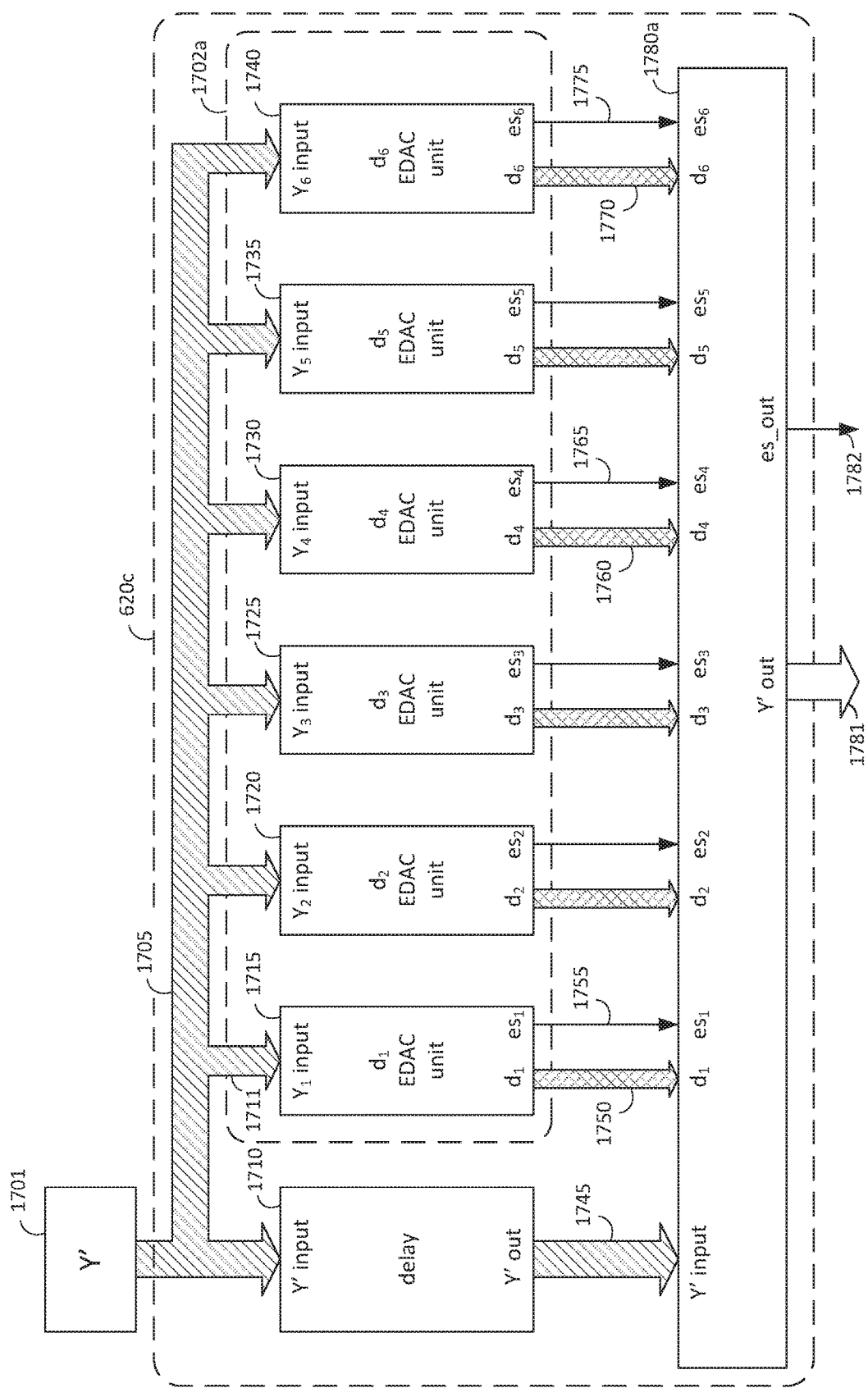
FIG. 17 is a block diagram of an exemplary error detection and correction pipeline circuit which operates on a full RRNS word.

An EDAC unit which accepts an entire RRNS word Y', and tests each trial digit set $Y_i$, and corrects the word if it is in error by no more than one RRNS digit, can be assembled using a plurality of single digit signed EDAC units, like the signed value EDAC 1600 of FIG. 16*a*. In FIG. 17, a "signed word EDAC" unit 620*c* comprises of a plurality of single-digit, signed EDAC units 1715, 1720, 1725, 1730, 1735, 1740. A digit selector circuit 1780*a* corrects any one RRNS digit in error by substituting the base extended digit from the valid trial digit set $Y_i$ for the digit in error in the input word Y' 1745 and outputs a corrected version of Y' at output bus 1781. An error detection and correction code 1782 may be generated to specify the outcome of each arithmetic result Y' 1781 after passing through the EDAC 620*c*.

Figure 18:
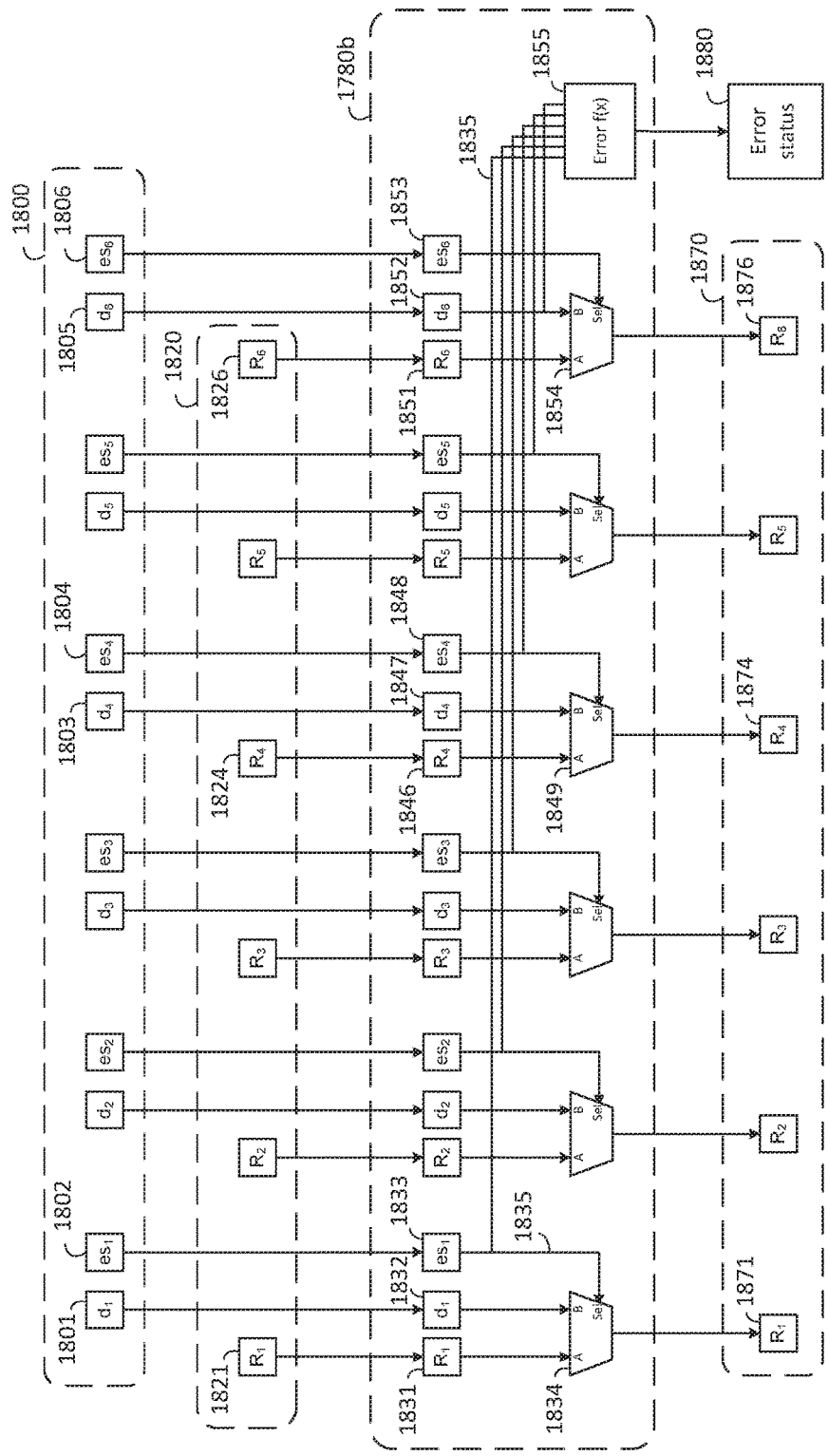
FIG. 18 is a block diagram of an exemplary error detection and correction digit selector circuit.

Details of an example digit selector circuit 1780*a* of FIG. 17 is shown depicted as digit selector unit 1780*b* of FIG. 18. Based upon the outcome of each single digit EDAC unit of FIG. 17, the base extended (skipped) digit $d_i$ generated from the trial digit set $Y_i$ is replaced into the output word Y' 1870 if its error status ($es_i$) code indicates the digit is in error, such as error code $es_1$ 1833 and digit $d_1$ 1832. Otherwise, if the $es_i$ code does not indicate an error, the original, delayed value of each digit $R_i$ 1831 from the input word Y' 1820 is passed by each associated digit selector, such as digit selector 1834, which is controlled by error code $es_1$ 1833 via selector control signal 1835. In some embodiments, all base extended results $d_i$, such as digit $d_1$ 1832 through digit $d_6$ 1852, are selected to the output 1870 when the original value Y' 1820 is not in error.

In order to design different outcomes for the output Y' upon each different error case, and in order that all cases of error detection and potential error correction be discerned, an error function 1855 is typically present within the signed word EDAC 620*c* and may be part of the digit selector unit 1780*b* by means of example. The error function 1855 may consist of a look-up table or dedicated logic to implement a logic function like the error logic table shown in FIG. 19. The logic function of the table in FIG. 19 accepts all error code status $es_1$ 1900 through $es_6$ 1905 from each single digit EDAC unit of FIG. 17 by means of example, and outputs a corresponding error code 1930.

In the row 1935 of the table of FIG. 19, each $es_i$ error code indicates that each single digit EDAC of FIG. 17 detects a valid positive value for each trial $Y_i$ since the value "1" indicates a positive value is detected according to the error code legend 1965. Therefore, according to the error code condition column 1925 indicates the error code output 1930 will indicate the code for "no error" detected in the input word Y' 1701 of FIG. 17. In the row 1940 of the table of FIG. 19, only the $es_4$ column 1903 indicates a valid (positive) $Y_4$ has been detected; in this case, the error condition 1925 indicates a single RRNS digit in error contained in Y' input 1701 has been corrected at the output Y' 1781 of FIG. 17, and an error code 1930 transmitted via error result code 1782 of FIG. 17 indicates a corresponding, distinct error code in row 1940 of FIG. 19.

Similar cases indicating the correction of a negative input value Y' is also present in rows 1945, 1950 of the table of FIG. 19. In the case of detection of a negative value $Y_i$, the corresponding $es_i$ error codes indicate a value of two (2) as indicated in the es error code legend 1965. If only one $Y_i$ indicates it is a valid negative value, and all other $Y_i$ indicate an invalid number range (es=0), the case of row 1950 is detected, and a digit in error is detected and corrected within a value Y' that is encoded with a negative RRNS value. The case that there is no $Y_i$ that lies in a legal range is indicated when all es codes are zero, as shown in row 1955 of the table of FIG. 19. In this case an un-corrected error is detected, which means two or more digits are in error. When the es error codes result in a condition which results in a logic dispute, such an example shown in row 1960, an un-corrected error condition is also detected, as this may indicate a fault of the EDAC itself.

In order that the digit selector 1780b be modified so that an original delayed value of Y' output from delay line 1710 be output when no error condition exists (i.e., all es codes indicate a legal range value of the same sign) the logic condition as shown in rows 1935, 1945 of the table of FIG. 19 may be used to gate the digit selectors such that the original delayed Y' is output. While this minor detail is not shown in FIG. 18, it is a preferred embodiment so that errors generated within recombination units of single digit EDACs are not passed, and thus errors generated from the EDAC unit itself are dramatically reduced.

The signed word EDAC 620c of FIG. 17 is similar in function to the EDAC unit 620a of FIG. 6a and may be used to perform continuous error detection and correction of arithmetic in matrix multiplication and other high-speed, pipelined applications using RNS arithmetic. This includes RNS arithmetic applications in cryptography, high-speed matrix operations, and other RNS arithmetic applications, and includes applications involving error processing of data transmission and data storage encoded in an RRNS format.

Streamlined Signed Word EDAC

The signed word EDAC 620c of FIG. 17 is a new and novel embodiment of the present invention. Alternative embodiments often-times seek to minimize resources or increase efficiency or speed. One alternate and preferred embodiment for a signed word EDAC unit of the present invention that increases efficiency and decreases latency is disclosed and is inspired by observing the amount of overlap of operations when mixed-radix conversion is applied to each digit set combination $Y_i$.

Figure 20:
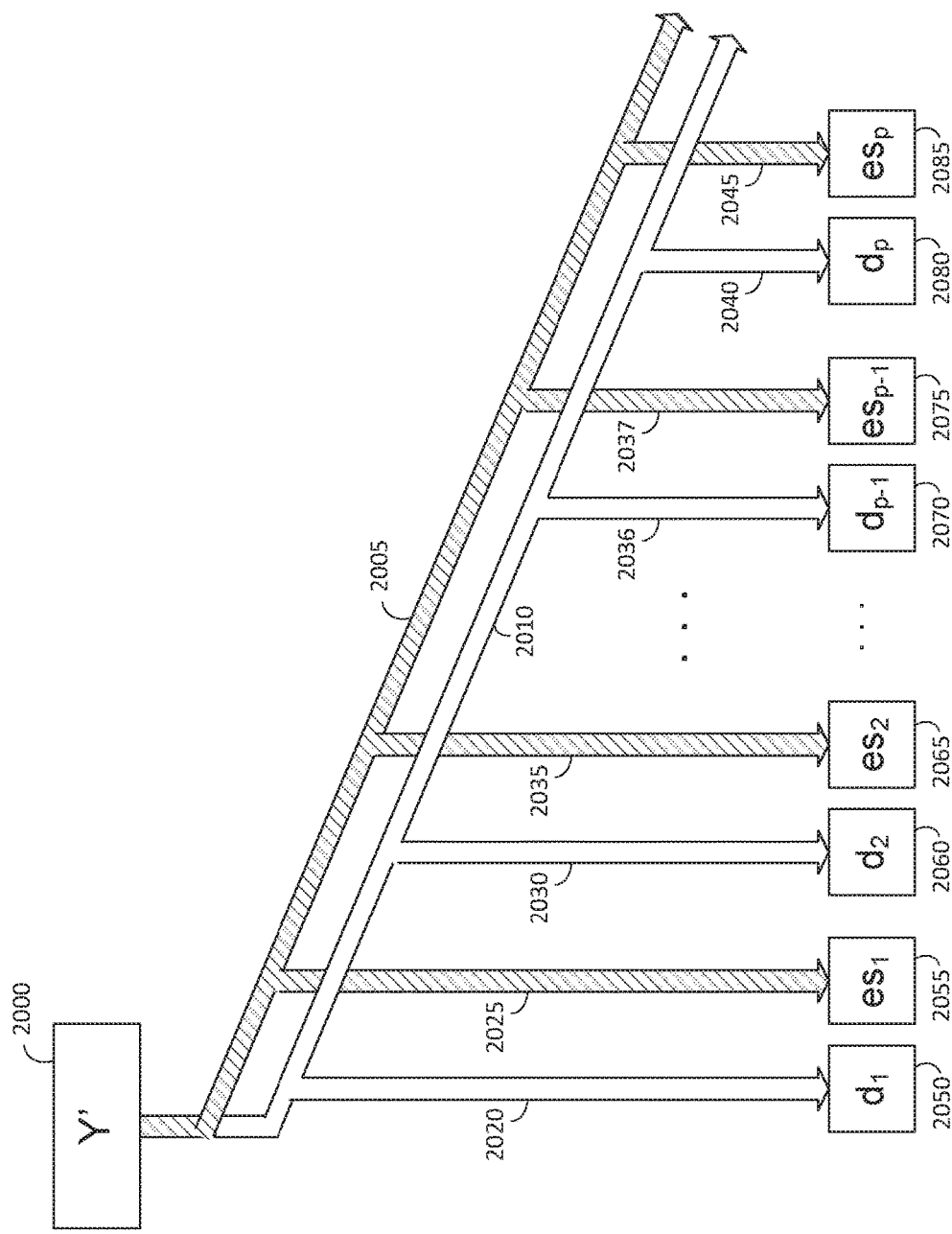
FIG. 20 is a block diagram illustrating an exemplary data flow for an error detection and correction unit requiring less resources.

Consider the block diagram of FIG. 20 which illustrates a primary flow of mixed-radix conversion 2005 comprising all RRNS digits of Y'. Upon inspection it can be observed many of the reduced $Y_i$ mixed-radix conversions can be derived in part from a main mixed-radix flow 2005. For example, the digit combination $Y_p$ which skips the last digit $d_p$ can derive it's mixed-radix digits from the main mixed-radix conversion path 2005 by ignoring the last mixed-radix digit converted.

Like-wise, other digit sets, such as digit set $Y_{(p-1)}$ can derive a significant portion of its mixed-radix digits from the main mixed-radix conversion path 2005 up to the second to last digit is converted, at which point the conversion branches to its own path 2037, since the second to last digit of the main branch is skipped, and only the last digit is converted by the mixed radix branch 2037. This last step is unique and is not repeated by another mixed-radix conversion branch, so this must be supported in a high-speed pipelined design.

In sharing arithmetic operations among mixed-radix conversion data flows indicated by FIG. 20, the same can be demonstrated for the flow of comparison data as well as digit recombination data for the trial digit sets $Y_i$. For example, data flow for a primary digit recombination unit for the entire word Y' is illustrated by the data flow 2010 in FIG. 20. It can be shown that the digit recombination of the second to last digit $d_{(p-1)}$ shares a significant portion of the data flow of the digit recombination for the last digit $d_p$. However, as the end of digit recombination for digit $d_{(p-1)}$ nears, the data flow for the recombination of the $d_{(p-1)}$ digit is re-directed to the flow of branch 2036 since the data flows diverge because of the difference in digit moduli reflecting differences in the underlying number system recombination equations.

Figure 21:
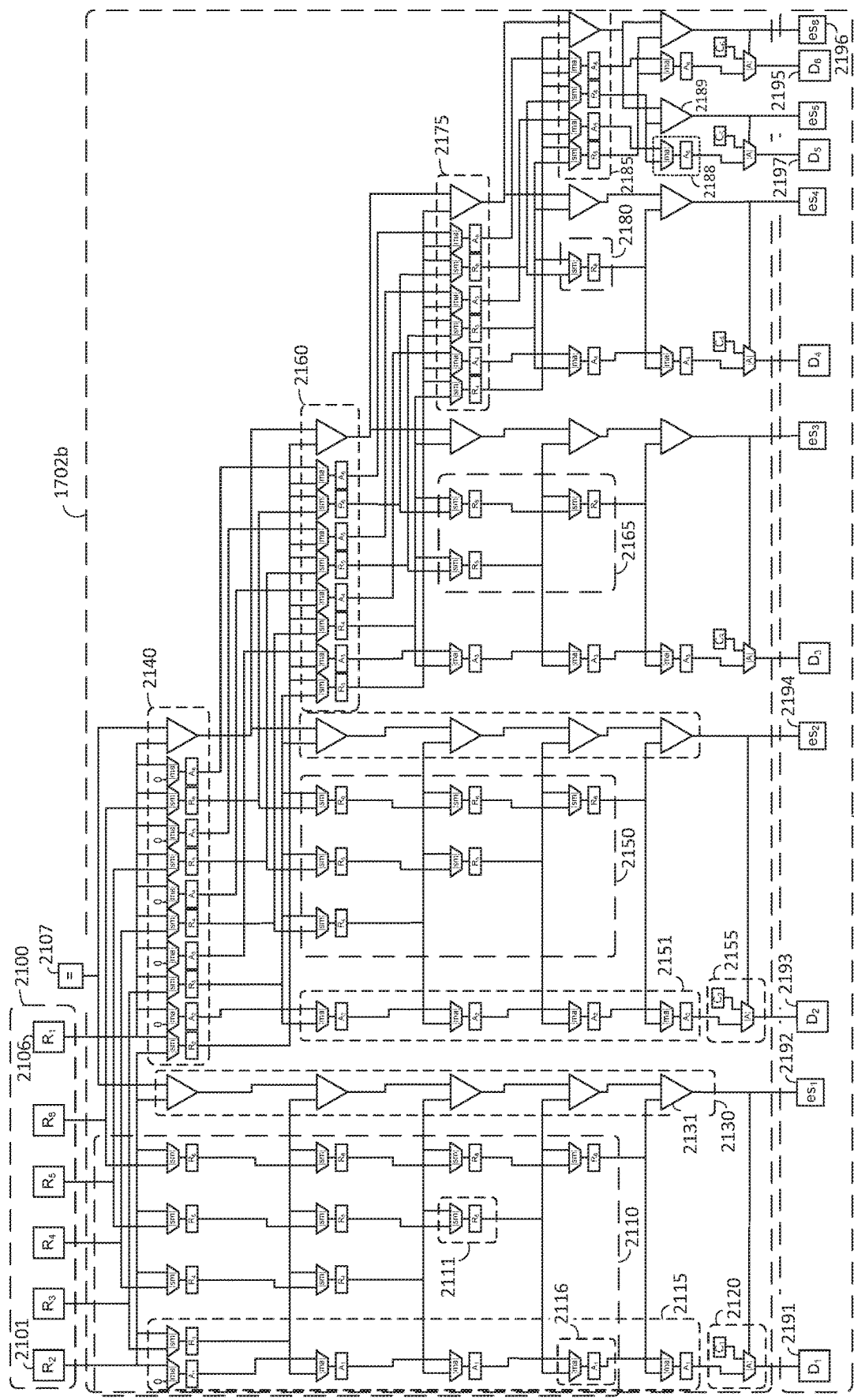
FIG. 21 is a block diagram of an exemplary error detection and correction pipeline circuit with an exemplary data flow which operates on a signed RRNS word and requires less resources.

FIG. 21 illustrates a preferred embodiment of a signed word EDAC unit 1702b using methods and apparatus of the present invention and utilizing the data flow and processing over-lap of mixed-radix conversion, skipped digit recombination and RRNS word comparison, required by each single digit EDAC 1702a of FIG. 17 and for each trial digit set $Y_i$ as illustrated in FIG. 20.

The EDAC 1702b of FIG. 21 shows the main portion of the logic of a signed-word, pipelined EDAC which replaces the need for a plurality of single digit EDACs 1702a of FIG. 17. In a preferred embodiment, a digit selector circuit, such as digit selector 1780a of FIG. 17 and digit selector 1780b of FIG. 18, is connected to the output 2190 of the EDAC 1702b of FIG. 21 to form a complete and flexible error correction circuit capable of discerning all error conditions as illustrated in FIG. 19, and capable of gating specific output values for specific error cases (ea., output zero for un-recoverable error) but is not shown in the FIG. 21 because of clarity and space restrictions.

In FIG. 21, an input RRNS word Y' 2100 is distributed to a number of processing elements, including the first stage of processing elements of a primary mixed-radix converter with full digit recombination unit 2140, and a secondary mixed-radix converter 2110 which also comprises a single digit EDAC, which furthermore includes a single digit recombination circuit 2115 and a signed word comparator unit 2130. The data flow of the primary mixed-radix converter (with full digit recombination and word compare) is comprised of circuitry sections 2140, 2160, 2175, 2185.

Each secondary mixed-radix data flow, as illustrated in FIG. 20 as data flows 2025, 2035, 2037, 2045, are shown in FIG. 21 as secondary mixed-radix converters 2110, 2150, 2165, 2180 of FIG. 21 by means of example. Each secondary mixed-radix converter, such as mixed-radix converter 2110, supports a single digit EDAC function by including a digit recombination circuit 2115 and a data word comparator 2130. Each secondary EDAC data flow of FIG. 21 is also coupled to a negative range digit correction circuit, such as range correction circuits 2120, 2155. Also, in FIG. 21 each single digit EDAC function produces a base extended digit $D_i$ and an associated error code $es_i$ as shown in the word EDAC output register 2190.

Unique to the connections for each single digit EDAC of FIG. 21 is that hardware in-efficiency present in the word EDAC 620c of FIG. 17 is eliminated by taking advantage of over-lapping operations. For example, the single digit EDAC with outputs $D_6$ 2195 and $es_6$ 2196 share much of the same processing performed in section 2140 as the single digit EDAC with outputs $D_2$ 2193 and $es_2$ 2194. This over-lapping of processing stages is progressively more efficient for digits of increasing index because more of the mixed-radix processing of the primary data path is shared and not duplicated.

The first digit $d_1$ EDAC processing is an exception as it requires circuitry for a full single digit EDAC, since there is no common, over-lapping mixed-radix conversion. As the primary mixed-radix proceeds, more over-lapping operations may be performed. The last two remaining EDACs with outputs $D_5$ 2197 and $D_6$ 2195 swap position as being the last digit converted from the last section 2185 of the primary mixed-radix converter. The digit recombination and word compare functions for each single digit EDAC function of FIG. 21 also share over-lapping logic in a like manner as the mixed-radix conversion and receive their shared operations from the primary recombination and comparator pipelines present in the primary data flow of circuit sections 2140, 2160, 2175, 2185.

FIG. 22a and FIG. 22b help clarify the explanation of the operation of the signed-word EDAC 1702b of FIG. 21 by illustrating a correction of a positive value in error in FIG. 22a, and by illustrating a correction of a negative value in error in FIG. 22b by means of example.

FIG. 22a illustrates an example calculation for an EDAC 1702b which accepts a signed value represented in a complement-M' representation. The table of FIG. 22a illustrates each trial digit set $Y_i$ in a derived RRNS format, and lists each trial digit set magnitude, and provides a means to show a comparison of the trial digit magnitude versus each associated range value, M/2 and $\sim R_i$. In the table of FIG. 22a each magnitude and constant are listed in mixed-radix number format which illustrates actual data values for RNS and mixed-radix digits that are processed by the EDAC 1702b circuit of FIG. 21.

After analysis of the table of FIG. 22a, it is observed that the trial digit set $Y_4$ of row 2238 has a magnitude that is less than the magnitude of the positive range value, M/2. This is observed by noting the value of the mixed-radix number <39, 6, 118, *, 58> is less than <0, 64, 65, *, 68>, since the latter value has a most significant digit=68 and the former has a most significant digit=58. In this case, since the trial value is detected as positive, and no other trial digit set $Y_i$ is a valid value in a valid number range, the trial digit set $Y_4$ is base extended to recover the skipped digit $d_4$ which is known to be in error in the original input value Y' as shown in row 2234. This result is summarized in the enclosed dotted line 2241 of FIG. 22a.

Note that while the value of the positive number range is always M/2, its mixed-radix representation differs for each trial digit set $Y_i$, as shown in each row of the range constant M/2 column 2220 of FIG. 22a. The reason for this difference in each row of the column 2220 is that the same value M/2 is represented differently in each distinct number system, each distinct number system distinguished by its associated range, =range($Y_i$). The range of a reduced RRNS number system $Y_i$ is itself distinct and is a direct consequence of the under-lying RRNS moduli set $Y_i$ range $M_i$ as expressed in Equation (31).

FIG. 22b illustrates an example error detection and correction calculation for an EDAC 1702b of FIG. 21 which accepts a negative value in error. In row 2283 a proper RRNS representation for a negative value Y' equal to the decimal value $-123456789_{10}$ is shown in RRNS digit columns $d_1$ 2250 through $d_6$ 2255 by means of example. In row 2284, the legal negative representation for Y' is placed into error by changing the $d_4$ digit from the value 76 to the improper value 23 by means of example. Each trial digit set $Y_i$ is listed in rows 2285 through row 2290. Magnitudes for each trial digit set $Y_i$ is provided in column 2260 and the same range constants used in the example of FIG. 22a are provided in the table in columns 2270, 2275. All numbers listed in the angle brackets < > are mixed-radix digits representing the column value in a distinct mixed-radix number format.

Upon analysis of the values in the table of FIG. 22b, it is seen that the magnitude of the trial digit set $Y_4$ is greater than its associated negative range constant $\sim R_4$ 2275 since the mixed-radix magnitude <86, 121, 12, *, 80, 148> is greater than the mixed-radix range constant <0, 64, 65, *, 70, 148>. The magnitude is greater than the negative range constant $\sim R_i$ because the second most significant digit of the magnitude is equal to eighty (=80) but the second most significant digit of the negative range constant is equal to seventy (=70); the second most significant mixed-radix digit specifies which mixed-radix word is greater in this case since the most significant digit of both numbers is =148.

No other trial digit set $Y_i$ of the table of FIG. 22b has a magnitude that is either greater than its associated negative range constant $\sim Ri$ in table column 2275 or lesser than its associated positive range constant M/2 in column 2270. Therefore, the action of the signed word EDAC 1702b is to indicate via its output word 2190 which specific trial digit set $Y_i$ is valid, and what the sign of the valid trial digit set is, and which digit is in error (the skipped digit), and further provides a based extended digit $d_i$ to replace the digit in error, which is $d_4$ in this example. FIG. 19 illustrates a typical logic table indicating how each possible combination of meaningful error codes ($es_i$) correspond to each EDAC operation result of column 1925, 1930 by means of example.

Figure 9E:
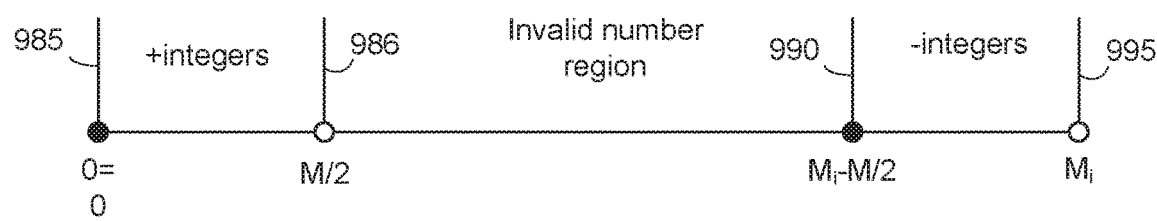
FIG. 9e is a number line illustrating a derived complement-Mi signed RRNS representation.

Because a single trial digit set $Y_4$ is detected as a value in a legal range as indicated by the number line of FIG. 9e, and furthermore, because $Y_4$ is detected as a negative legal value, the trial digit set $Y_4$ is first base extended to recover the skipped digit $d_4$ as performed in the case of the positive value $Y_4$ of example FIG. 22a and according to step 1235 of the flowchart of FIG. 12; next a correction constant $C_i$ is added to the base extended result as described by step 1245 of the flowchart of FIG. 12. The example values of the calculation just described is shown enclosed in dotted lines 2295. Note that correction constants $C_i$ are RRNS values where only one digit is non-zero; therefore, it is customary to refer to the correction constant $C_i$ as a word or digit constant depending on context.

Further note that negative range constants $\sim R_i$ of column 2275 of the table of FIG. 22b are not only represented in a distinct number system, but that the magnitudes are different, i.e. they are distinct values as well. This is a result of the fact that the value for each $\sim R_i$ is equal to the difference $M_i - M/2$, and it is recognized that each $M_i$ is different according to Equation (31). Likewise, each correction constant $C_i$ is formally represented in a distinct RRNS representation as shown in the column 2280 and each correction constant $C_i$ represents a different distinct value since the value $M' - M_i$ changes for each digit system $Y_i$.

Error Correction of More than One Digit

It is noted that the techniques and method of the present invention as disclosed may be extended to EDAC systems correcting more than a single digit in error. Intuitively, the single digit methods and apparatus disclosed herein are modified to allow trial digits sets to skip more than one digit, thereby dramatically increasing the number of trial digit sets to test. In this case, each trial digit set $Y_i$ skips more than one digit.

To understand how the ranges $M_i$ of each $Y_i$ are affected by an EDAC correcting two digits, the relation for the trial digit range is modified as, $$M_{i,j} = \frac{1}{m_i * m_j} \prod_{k=1}^{p} m_k \quad (58)$$

Therefore, each trial digit set notation $Y_{i,j}$ includes two indexes, i and j, for which $1 \le i \le p$, $1 \le j \le p$, and $i \ne j$.

In the example herein, to enable correction of two digits out of four non-redundant digits in Y', four redundant digits are required for a total of p=8 digits. The total number of distinct sets $Y_{i,j}$ of six (6) digits is therefore given by, $$t = \binom{8}{8-2} = 28 \quad (59)$$

Other schemes are available for decreasing the number of trial sets $Y_{i,j}$, such as creating a smaller number of digit "sub-groups" for example, but come at the cost of increased redundant digits or other tradeoffs and are not explained herein. Experts familiar with the design and optimization of testing combinations in the context of error correction, and using the material presented herein, can effectively extend the techniques and apparatus for an EDAC supporting single digit error correction to an EDAC supporting multiple error correction.

Error Detection and Correction of Fixed-Point Arithmetic

Error detection of fixed-point arithmetic of the format described in FIG. 7b and explained in detail in U.S. Pat. No. 9,081,608, requires the extended machine word $Y_i$ which is normally large enough to hold an intermediate product, $Y_{IP}$, to be further extended by one or more digits required to perform a desired level of error detection and correction.

For example, the TPU of FIG. 7a supports a machine word 770 with parameters 772 shown in FIG. 7b and supports an RNS machine word of 8 digits, each digit being 18-bits wide. The non-redundant range of the operand is 4 digits (f=2, w=2), and a total word for product summation is 8 words (p=8).

In order that the dot products produced using the 8-digit machine word 770 support detecting and correcting a single digit in error, two additional redundant digits are extended to the machine word 770 resulting in a 10-digit machine word (p=10) not shown. In practice, the value of the additional redundant moduli must be greater than the existing moduli of FIG. 7c, so some re-arrangement of moduli is required to keep all digit moduli within 18 bits wide.

Provided that two additional digits (ea., two additional digit matrix multipliers 642) are extended to the machine word 770 of the TPU of FIG. 6b, product summations can be error corrected using EDAC units 620b through 621b of FIG. 6b, and EDAC units 620a through 621a of FIG. 6a.

Figure 1:
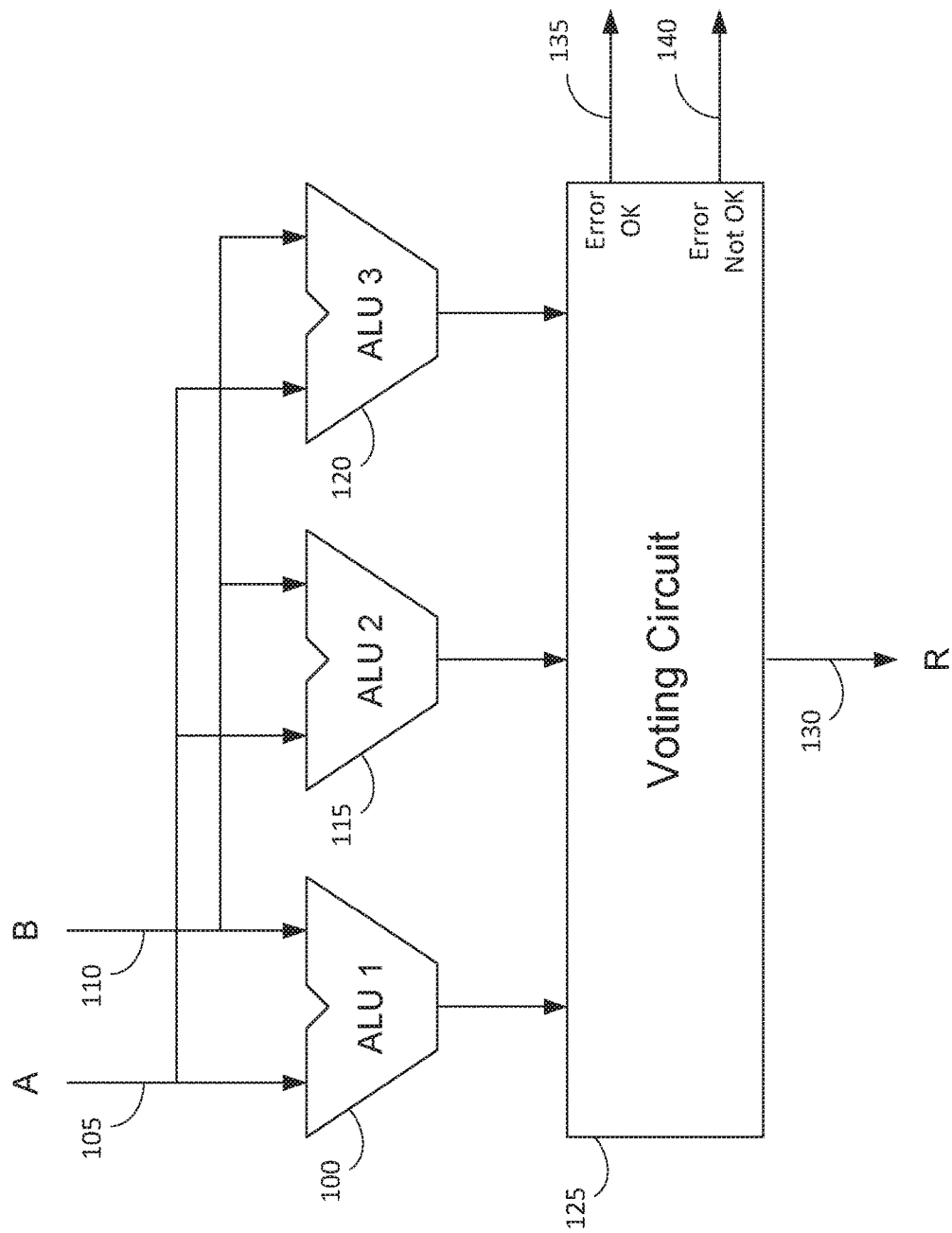
FIG. 1 is a block diagram of a prior art voting circuit for error detection and correction of arithmetic.

It is noted the addition of two additional digit matrix multipliers increases TPU circuit resources by approximately 20%, which is less than the 300% resources required using the triplication scheme of FIG. 1.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for performing error correction of an arithmetic result in a residue number format, the arithmetic result having one or more digits in error, the method comprising:
generating a plurality of trial digit sets, each of the plurality of trial digit sets excluding one or more digits of the arithmetic result and comprising a test value in a distinct number system;
comparing each of the plurality of trial digit sets to a positive range value, the positive range value encoded in a plurality of distinct number systems;
comparing each of the plurality of trial digit sets to an associated distinct negative range value, each associated distinct negative range value having a distinct negative number range and encoded in a distinct number system; and
base extending one or more excluded digits associated with at least one of the plurality of trial digit sets to generate one or more base extended digits when the at least one of the plurality of trial digit sets is less than the positive range value or when the at least one of the plurality of trial digit sets is greater than the associated distinct negative range value;
applying a correction constant to the one or more base extended digits when the at least one of the plurality of trial digit sets is greater than the associated distinct negative range value thereby creating one or more corrected base extended digits;
wherein a corrected arithmetic result comprises the arithmetic result excluding the one or more digits in error and including the one or more corrected base extended digits.

2. The method of claim 1, wherein the one or more corrected base extended digits are adjusted by a correction value when the at least one of the plurality of trial digit sets is greater than the associated distinct negative range value.

3. The method of claim 1, further comprising detecting an error when the at least one of the plurality of trial digit sets is neither less than the positive range value nor greater than the associated distinct negative range value.

4. A method for performing error correction of an arithmetic result in a residue number format, the arithmetic result having one or more digits in error, the method comprising:
generating a plurality of trial digit sets, each of the plurality of trial digit sets comprising a test value and excluding one or more digits of the arithmetic result;
comparing the test value to a positive number range and selecting the test value when the test value is in the positive number range;
comparing the test value to a negative number range and selecting the test value when the test value is in the negative number range;
base extending one or more excluded digits associated with the selected test value, thereby creating one or more base extended digits; and
applying a correction constant to the one or more base extended digits when the selected test value is in the negative number range;
wherein a corrected arithmetic result comprises the test value excluding the one or more digits in error and including the one or more base extended digits.

5. The method of claim 4, wherein the test value is in an invalid number range when the test value is greater than the positive number range and less than the negative number range.

6. The method of claim 5, further comprising detecting the one or more digits in error when at least one of the one or more test values are in the invalid number range.

7. A method for performing error correction of a residue number value having one or more digits in error, the method comprising:
excluding one or more digits from the residue number value thereby creating a first trial digit set;
converting one or more excluded digits of the residue number value to a mixed radix format, thereby creating a first partially converted residue number value;
excluding one or more digits of the first partially converted residue number value, thereby creating a partially converted second trial digit set;
converting one or more excluded digits of the second trial digit set to a mixed radix format, thereby creating a second partially converted residue number value;
excluding one or more digits of the second partially converted residue number value, thereby creating a partially converted third trial digit set;
converting each of the trial digit sets to a mixed radix format, thereby creating one or more fully converted trial digit sets having one or more excluded digits associated therewith;
recovering the one or more excluded digits of each of the one or more fully converted trial digit sets thereby creating one or more corrected digit candidates for each of the one or more fully converted trial digit sets; and
selecting one or more corrected digit candidates associated with the one or more fully converted trial digit sets when the one or more fully converted trial digit sets is within a legal number range, thereby creating one or more selected digit candidates;
generating a corrected value comprising the residue number value and a digit value of the one or more selected digit candidates.

8. The method of claim 7, wherein the one or more selected digit candidates have the same modulus as the one or more digits in error.

9. The method of claim 7, wherein the one or more fully converted trial digit sets are within the legal number range when the one or more fully converted trail digit sets are either less than a positive range value or greater than a negative range value.

10. The method of claim 9, wherein determining whether the one or more fully converted trial digit sets are within the legal number range occurs via a comparison of the one or more fully converted trial digit sets in mixed radix format.

* * * * *